(12) United States Patent
Soda

(10) Patent No.: US 11,152,329 B2
(45) Date of Patent: Oct. 19, 2021

(54) METHOD OF SEPARATING BONDED SUBSTRATE, METHOD OF MANUFACTURING SEMICONDUCTOR STORAGE DEVICE, AND SUBSTRATE SEPARATION APPARATUS

(71) Applicant: TOSHIBA MEMORY CORPORATION, Minato-ku (JP)

(72) Inventor: Eiichi Soda, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/560,404

(22) Filed: Sep. 4, 2019

(65) Prior Publication Data

US 2020/0294963 A1 Sep. 17, 2020

(30) Foreign Application Priority Data

Mar. 11, 2019 (JP) .............................. JP2019-043952

(51) Int. Cl.
*H01L 23/00* (2006.01)
*H01L 21/56* (2006.01)

(52) U.S. Cl.
CPC ............ *H01L 24/98* (2013.01); *H01L 21/568* (2013.01); *H01L 24/799* (2013.01)

(58) Field of Classification Search
CPC ..... H01L 24/98; H01L 24/799; H01L 21/568; H01L 21/67092; H01L 2221/68381; H01L 2221/68318; H01L 2221/68345; H01L 21/6835; H01L 24/02–09; H01L 24/80–97; H01L 21/2007; H01L 21/76251–76259; H01L 21/683–68792; H01L 2221/68304–68395

(Continued)

(56) References Cited

U.S. PATENT DOCUMENTS 8,536,629 B2 9/2013 Tada et al.
9,177,890 B2 11/2015 Du (Continued)

FOREIGN PATENT DOCUMENTS

JP 2877800 B2 3/1999
JP 5617835 B2 11/2014

(Continued)

*Primary Examiner* — Mohammad M Hoque
(74) *Attorney, Agent, or Firm* — Oblon, McClelland, Maier & Neustadt, L.L.P.

(57) ABSTRACT

A method of an embodiment separates a bonded substrate including first and second substrates. The bonded substrate includes a carbon film on a first surface of the first substrate, a memory cell on the carbon film, a first connection terminal on the memory cell, a transistor on a first surface of the second substrate, and a second connection terminal on the transistor. In opposing direction of the first surfaces of the first and second substrates, a side of the first substrate on which the memory cell is located and a side of the second substrate on which the transistor is located are joined together, and the first and second connection terminals are mutually connected. The method includes removing the carbon film, and separating the bonded substrate into the first substrate with the first surface exposed and the second substrate on which the memory cell and the transistor are located.

12 Claims, 23 Drawing Sheets

(58) Field of Classification Search
USPC .......................................................... 438/107
See application file for complete search history.

(56) References Cited

U.S. PATENT DOCUMENTS

| | | | |
|---|---|---|---|
| 10,629,616 B1* | 4/2020 | Kai | H01L 24/92 |
| 10,665,581 B1* | 5/2020 | Zhou | H01L 24/43 |
| 2014/0199823 A1 | 7/2014 | Nomura et al. | |
| 2015/0102832 A1* | 4/2015 | Kogure | G01R 1/0483 |
| | | | 324/757.01 |
| 2015/0155505 A1* | 6/2015 | Yamazaki | B23K 26/0622 |
| | | | 257/40 |
| 2017/0103994 A1* | 4/2017 | Fukuzumi | H01L 25/18 |
| 2018/0374864 A1* | 12/2018 | Fukuzumi | H01L 24/00 |
| 2019/0238135 A1* | 8/2019 | Lin | H03K 19/1737 |
| 2019/0244850 A1* | 8/2019 | Berger | H01L 21/7813 |
| 2019/0273090 A1* | 9/2019 | Fukuzumi | H01L 25/0657 |
| 2019/0333782 A1* | 10/2019 | Wang | H01L 23/49822 |
| 2020/0203364 A1* | 6/2020 | Totoki | H01L 27/11573 |
| 2020/0227397 A1* | 7/2020 | Yada | H01L 23/528 |
| 2020/0243498 A1* | 7/2020 | Zhang | H01L 25/0657 |
| 2020/0258817 A1* | 8/2020 | Na | H01L 27/11582 |
| 2020/0266146 A1* | 8/2020 | Nishida | H01L 23/5226 |
| 2020/0266182 A1* | 8/2020 | Nishikawa | H01L 24/03 |
| 2020/0294963 A1* | 9/2020 | Soda | H01L 24/799 |

FOREIGN PATENT DOCUMENTS

| | | |
|---|---|---|
| JP | 6306063 B2 | 4/2018 |
| WO | WO 2012/169060 A1 | 12/2012 |

* cited by examiner

METHOD OF SEPARATING BONDED SUBSTRATE, METHOD OF MANUFACTURING SEMICONDUCTOR STORAGE DEVICE, AND SUBSTRATE SEPARATION APPARATUS

CROSS-REFERENCE TO RELATED APPLICATIONS

This application is based upon and claims the benefit of priority from Japanese Patent Application No. 2019-043952, filed on Mar. 11, 2019; the entire contents of which are incorporated herein by reference.

FIELD

Embodiments described herein relate generally to a method of separating a bonded substrate, a method of manufacturing a semiconductor storage device, and a substrate separation apparatus.

BACKGROUND

Semiconductor storage devices including memory cells and transistors may be manufactured by forming memory cells on a support substrate, forming transistors on a circuit board such as a semiconductor substrate, and bonding together the substrate surface on which the memory cells are formed and the substrate surface on which the transistors are formed. The support substrate is no longer necessary, therefore, removed by grinding, for example.

DETAILED DESCRIPTION

According to one embodiment, in general, a method is provided for separating a bonded substrate including a first substrate and a second substrate. The bonded substrate includes a carbon film on a first surface of the first substrate, a memory cell on the carbon film, a first connection terminal on the memory cell, a transistor on a first surface of the second substrate, and a second connection terminal on the transistor. In a direction in which the first surfaces of the first substrate and the second substrate oppose each other, a side of the first substrate on which the memory cell is located and a side of the second substrate on which the transistor is located are joined together, and the first and second connection terminals are mutually connected. The method includes removing the carbon film, and separating the bonded substrate into the first substrate with the first surface exposed and the second substrate on which the memory cell and the transistor are located.

Hereinafter, embodiments and modifications will be described in detail with reference to the accompanying drawings. The embodiments and modifications are merely exemplary and unintended to limit the scope of the present invention. The following embodiments and modifications include elements easily conceivable by those skilled in the art or substantially the same elements.

First Embodiment

A semiconductor storage device of a first embodiment will be described with reference to FIG. 1A to FIG. 19.

Exemplary Structure of Semiconductor Storage Device

Figure 1A:
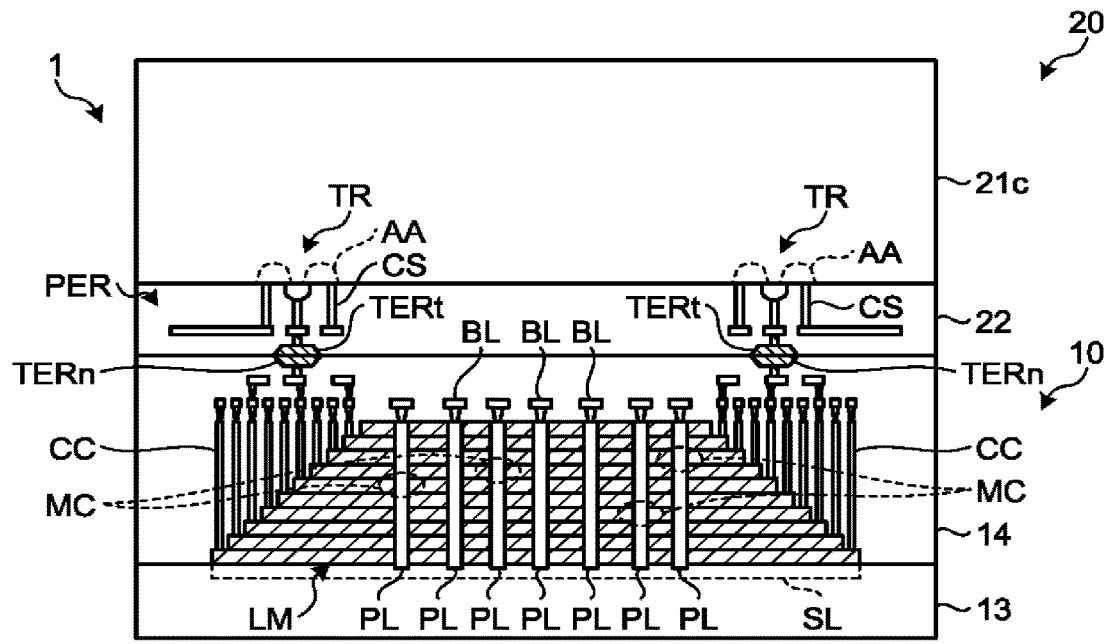
FIG. 1A and FIG. 1B are sectional views schematically illustrating an exemplary structure of a semiconductor storage device according to a first embodiment.
Figure 1B:
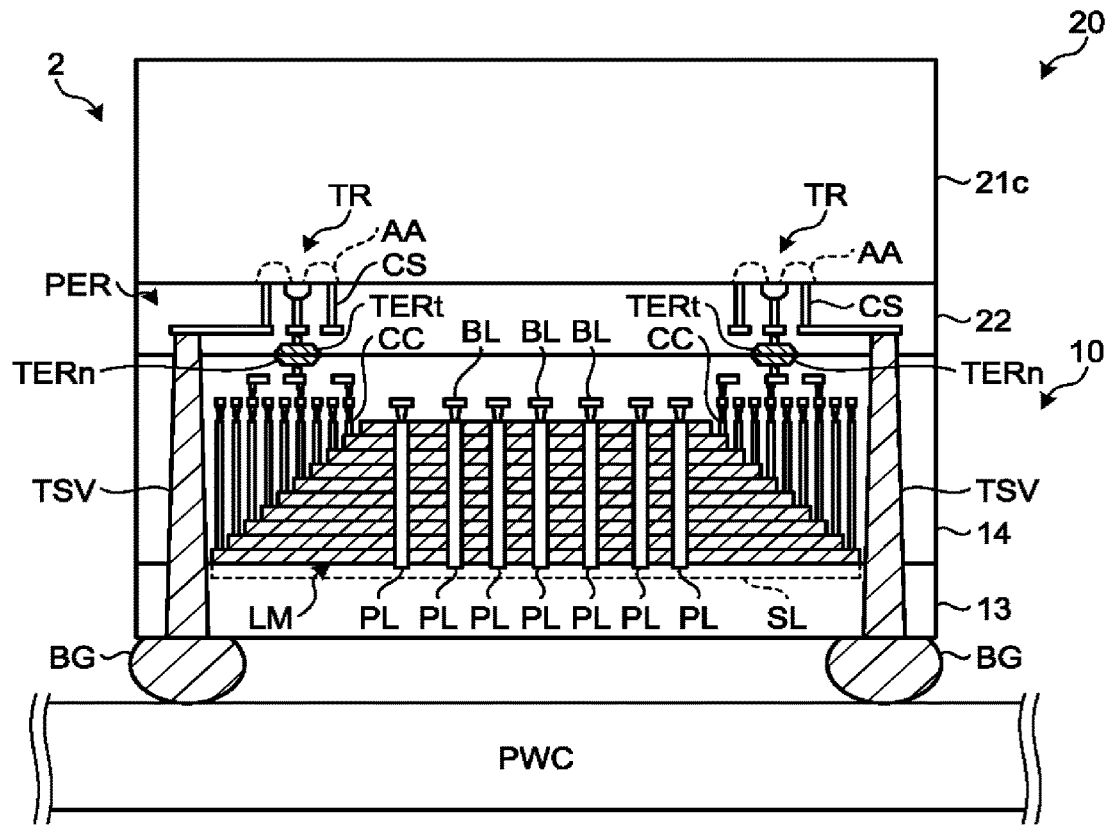

FIG. 1A and FIG. 1B are schematic sectional views illustrating an exemplary structure of a semiconductor storage device 1 according to the first embodiment. FIG. 1A is a sectional view illustrating an exemplary structure of the semiconductor storage device 1 before mounting a printed wiring board PWC. FIG. 1B is a sectional view illustrating an exemplary structure of the semiconductor storage device 1 after mounting the printed wiring board PWC.

As illustrated in FIG. 1A, the semiconductor storage device 1 includes a cell structure 10 and a semiconductor circuit 20.

The cell structure 10 includes an insulation layer 13 of a chip shape, a source line SL wired on surface of the insulation layer 13, and a multilayer element LM including a plurality of conductive layers placed on top of each other via an insulation layer. At both ends of the multilayer element LM, the conductive layers are formed in a stepwise manner, and each step of the conductive layers is connected to a contact CC. The top end of the contact CC is connected to upper layer wiring via a plug.

The upper layer wiring is connected to a connection terminal TERn via a plug. The connection terminal TERn is made of copper (Cu), for example.

The multilayer element LM includes a plurality of pillars PL arranged in a matrix. The pillars PL penetrate the multilayer element LM to the source line SL in a layered direction. Each pillar PL includes a memory layer and a channel layer. The channel layer of the pillar PL is connected at the bottom end to the source line SL, and connected at the top end to a bit line BL via a plug, for example. Memory cells MC are arranged at the intersections between the pillars PL and the conductive layers of the multilayer element LM.

Thus, the semiconductor storage device 1 is formed as a three-dimensional non-volatile memory including three-dimensionally arrayed memory cells MC, for example.

The multilayer element LM, the contacts CC, the plugs, the upper layer wiring, and the bit line BL are covered with an insulation layer 14. The connection terminal TERn is exposed to the top face of the insulation layer 14.

The semiconductor circuit 20 includes a base 21c of a chip shape, and a peripheral circuit PER including a plurality of transistors TR arranged on the base 21c. Each of the transistors TR is, for example, a complementary metal oxide semiconductor (CMOS) transistor, and includes an active region AA as a diffusion layer on a surface layer of the base 21c. Each of the transistors TR is connected to upper layer wiring via a contact CS.

The upper layer wiring is connected to a connection terminal TERt via a plug. The connection terminal TERt is made of copper (Cu), for example.

The peripheral circuit PER including the transistors TR, the contacts CS, and the plugs are covered with an insulation layer 22. The connection terminal TERt is exposed to the top surface of the insulation layer 22.

One side of the cell structure 10 on which the memory cells MC are arranged and one side of the semiconductor circuit 20 on which the peripheral circuit PER and the other elements are arranged are joined together. More specifically, the insulation layer 14 covering the memory cells MC and the insulation layer 22 covering the peripheral circuit PER are joined together, and the connection terminal TERn exposed to the top surface of the insulation layer 14 and the connection terminal TERt exposed to the top surface of the insulation layer 22 are joined together.

In such a manner, the cell structure 10 and the semiconductor circuit 20 are electrically conducted through the connection terminals TERn and TERt. Thereby, the peripheral circuit PER applies a given voltage to the conductive layers of the multilayer element LM connected to the memory cells MC, contributing to the write operation and the read operation to the memory cells MC, for example.

As illustrated in FIG. 1B, the semiconductor storage device 1 is provided with through vias TSV that penetrate the whole insulation layers 13 and 14 and a part of the insulation layer 22, for example, front the insulation layer 13 and that are connected to the upper layer wiring of the transistors TR. The end faces of the through vias TSV exposed to the insulation layer 13 are connected to the printed wiring board PWC via ball grids BG, for example. This creates a package 2 containing the semiconductor storage device 1 mounted on the printed wiring board PWC.

Exemplary Manufacturing Process of Semiconductor Storage Device

Next, an example of the manufacturing process of the semiconductor storage device 1 will be described with reference to FIG. 2A to FIG. 11. FIG. 2A to FIG. 11 are flow diagrams of an exemplary manufacturing process of the semiconductor storage device 1 according to the first embodiment.

Figure 2A:
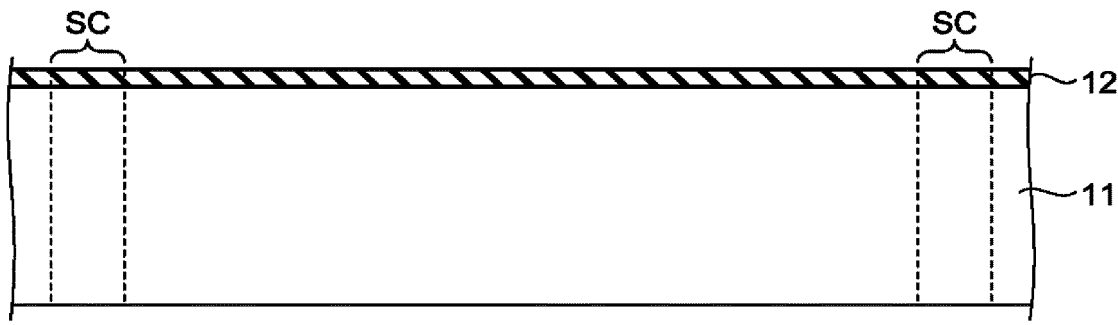
FIG. 2A to FIG. 2C are flow diagrams of an exemplary manufacturing process of the semiconductor storage device according to the first embodiment.
Figure 2B:
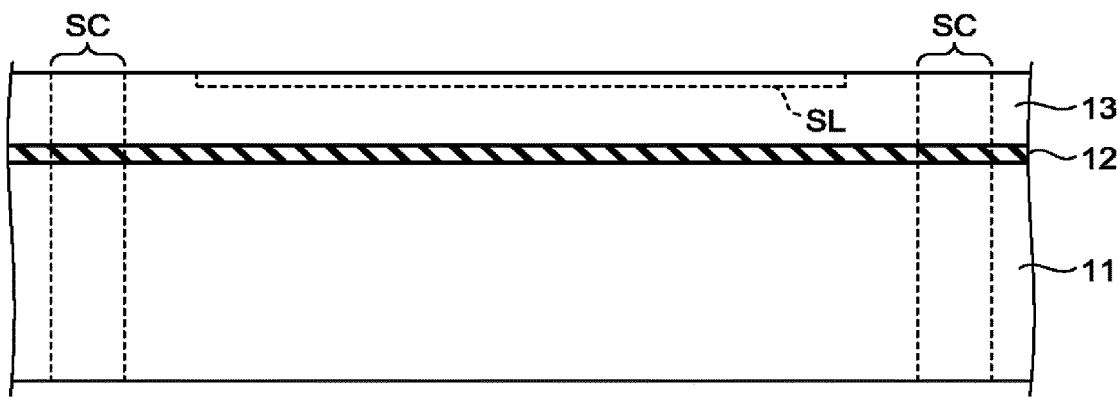

As illustrated in FIG. 2A, a support substrate 11 entirely covered with a carbon film 12, such as silicon substrate, is prepared. The support substrate 11 serves to support the multilayer element LM during the manufacturing process. As described later, a plurality of multilayer elements LM is formed on the support substrate 11 across scribe lines SC. The scribe lines SC are regions along which the individual multilayer elements LM are diced in subsequent process, and the scribe lines SC are arranged, for example, in a grid form on the support substrate 11.

The carbon film 12 mainly includes carbon and is formed by chemical vapor deposition (CVD), for example. It is preferable to form the carbon film 12 at a relatively high temperature so as to prevent the carbon film 12 from changing in thickness and quality through subsequent heat treatment.

As illustrated in FIG. 25, the insulation layer 13 is formed on the carbon film 12. The source line SL is formed on the surface layer of the insulation layer 13.

Figure 2C:
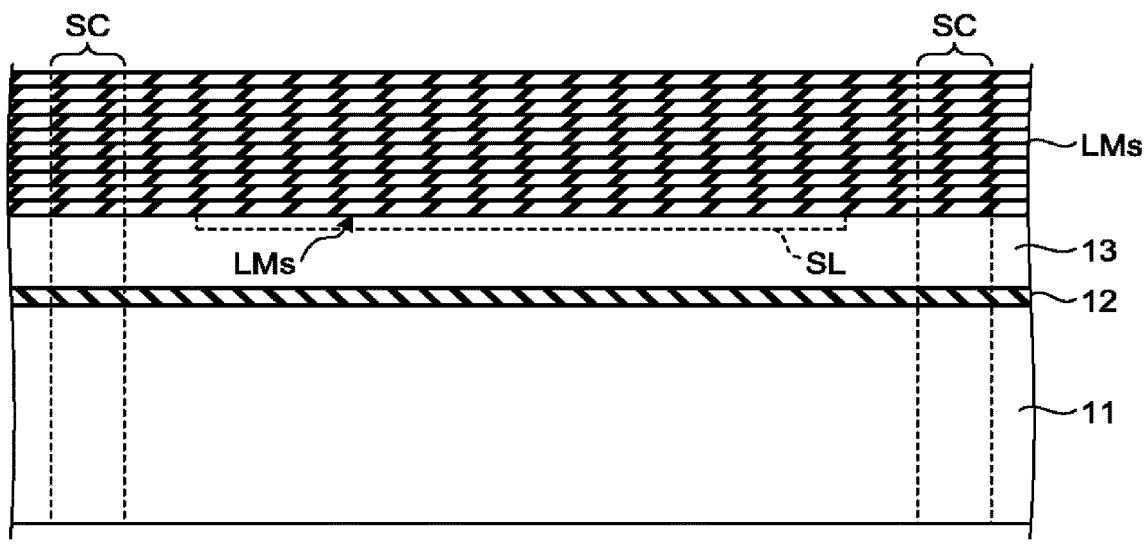

As illustrated in FIG. 2C, sacrifice layers are laminated on the insulation layer 13 via insulation layers to cover the source line SL, thereby forming a multilayer element LMs. The sacrifice layers are replaced with conductive layers in subsequent process, to create a multilayer element LM.

Figure 3A:
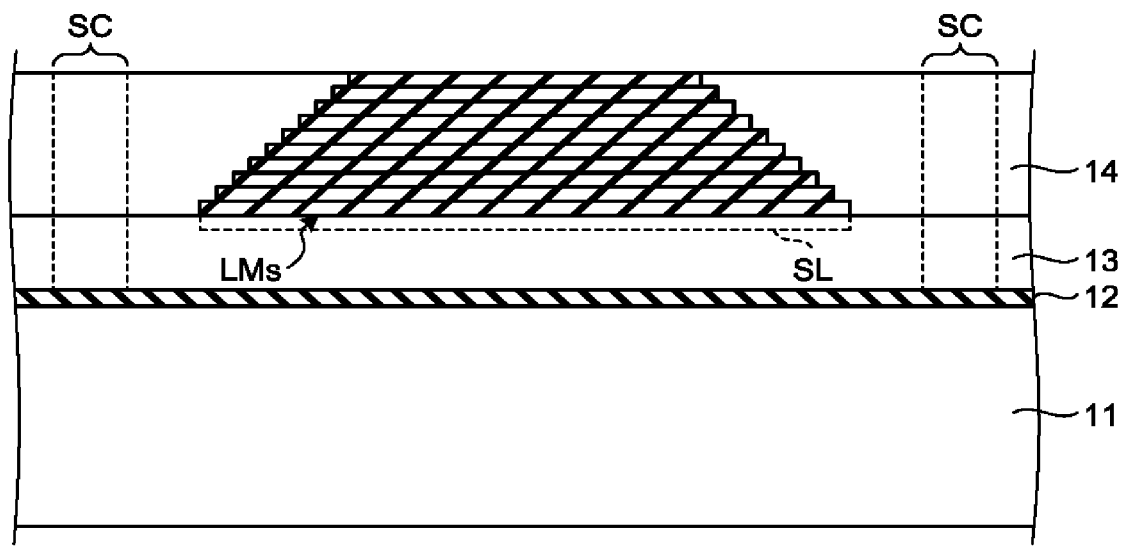
FIG. 3A and FIG. 3B are flow diagrams of an exemplary manufacturing process of the semiconductor storage device according to the first embodiment.

As illustrated in FIG. 3A, by processing the multilayer element LMs, a multilayer element LMs having both stepwise ends is formed. A plurality of multilayer elements LMs having both stepwise ends is formed on the support substrate 11 across the scribe lines SC. The cell structure 10 is formed by individually cutting out the multilayer elements LM including the conductive layers replaced with the sacrifice layers along the scribe lines SC in subsequent process. The stepwise multilayer elements LMs are covered with the insulation layer 14.

Figure 3B:
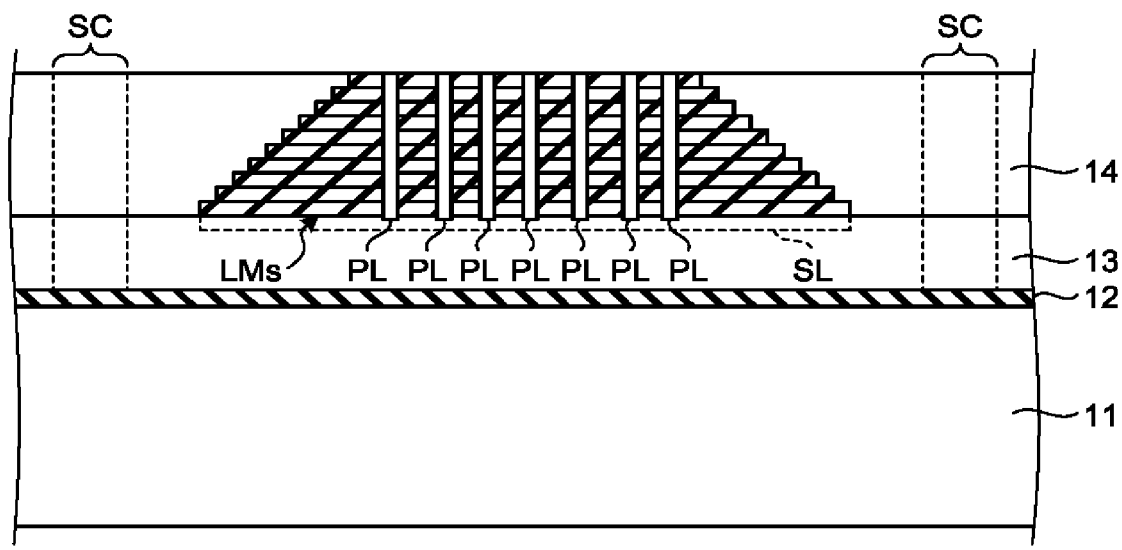

As illustrated in FIG. 3B, a plurality of pillars PL is formed inside each multilayer element LMs. The pillars PL penetrate the multilayer elements LMs to the source line SL in a layered direction. The pillars PL are formed by creating memory holes penetrating the multilayer element LMs and filling the memory holes with memory layers and channel layers.

In addition, a plurality of slits (not illustrated) is formed in the multilayer elements LMs. The slits extend horizontally to vertically divide the multilayer elements LMs in FIG. 3B. The slits penetrate the individual multilayer elements LMs to the source line SL.

Figure 4A:
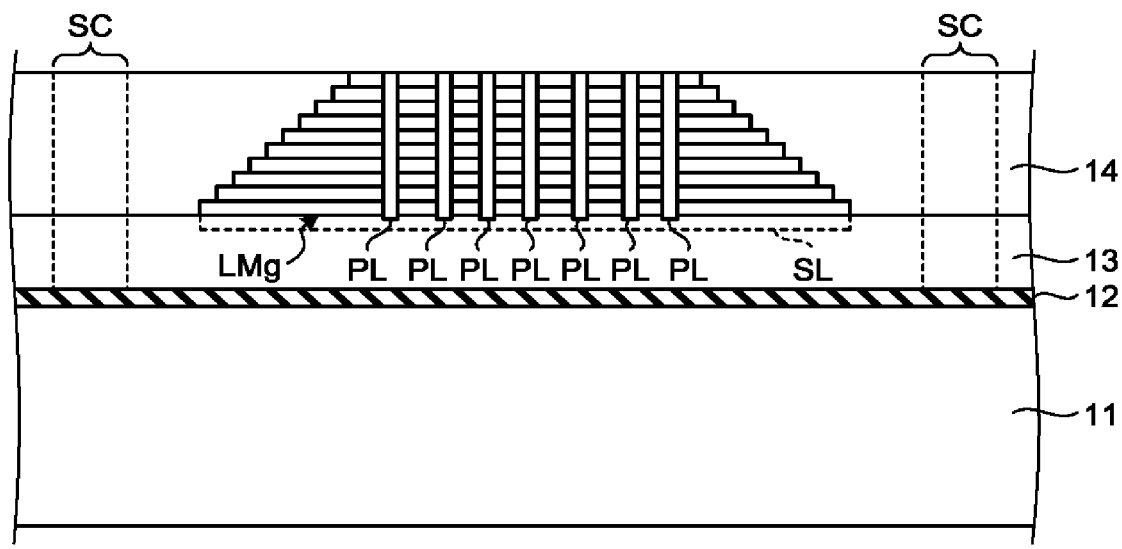
FIG. 4A and FIG. 4B are flow diagrams of an exemplary manufacturing process of the semiconductor storage device according to the first embodiment.

As illustrated in FIG. 4A, the sacrifice layers are removed from the multilayer element LMs through the slits (not illustrated) to form a multilayer element LMg including the remaining insulation layers. There are air gaps between the insulation layers, resulting from the removal of the sacrifice layers.

Figure 4B:
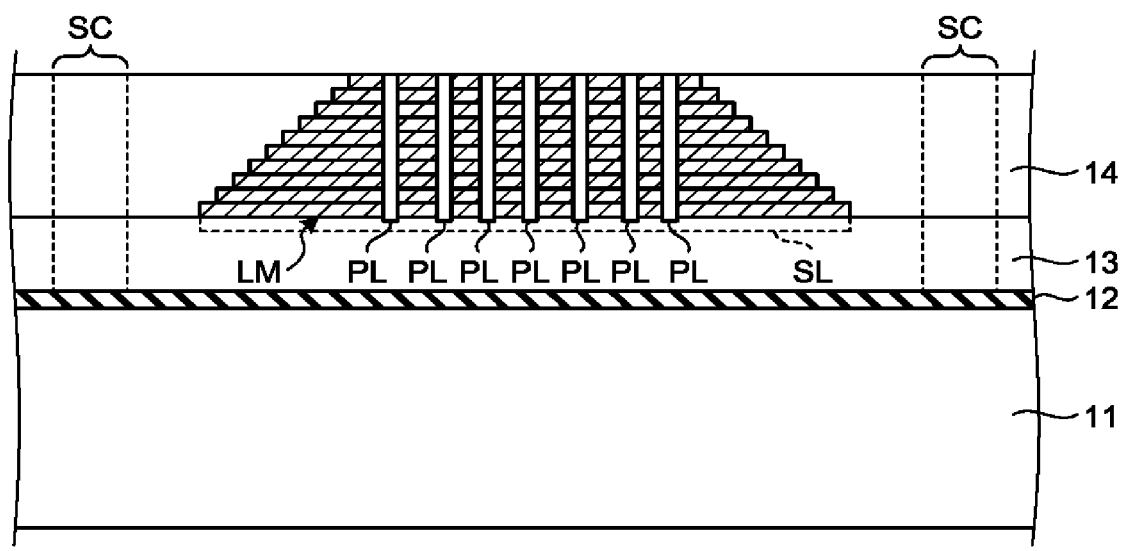

As illustrated in FIG. 4B, the air gaps between the insulation layers of the multilayer element LMg are filled with a conductive material through the slits (not illustrated), to form a multilayer element LM including the conductive layers laminated between the insulation layers.

Figure 5A:
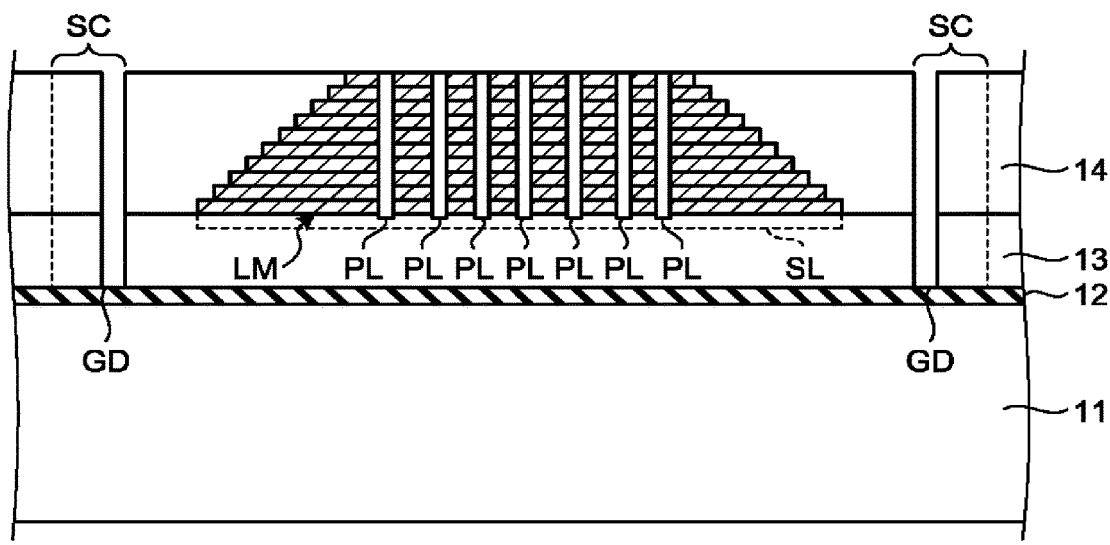
FIG. 5A and FIG. 5B are flow diagrams of an exemplary manufacturing process of the semiconductor storage device according to the first embodiment.

As illustrated in FIG. 5A, grooves GD are created in areas corresponding to the scribe lines SC surrounding the outer periphery of each multilayer element LM. The grooves GD extend to the carbon film 12 through the insulation layers 14 and 13. In the support substrate 11, the grooves GD are arranged, for example, in a grid form as with the scribe lines SC. At the end of the support substrate 11, both ends of each groove GD communicate with outside of the insulation layers 14 and 13. That is, both ends of each groove GD open to outside the insulation layers 14 and 13.

Figure 5B:
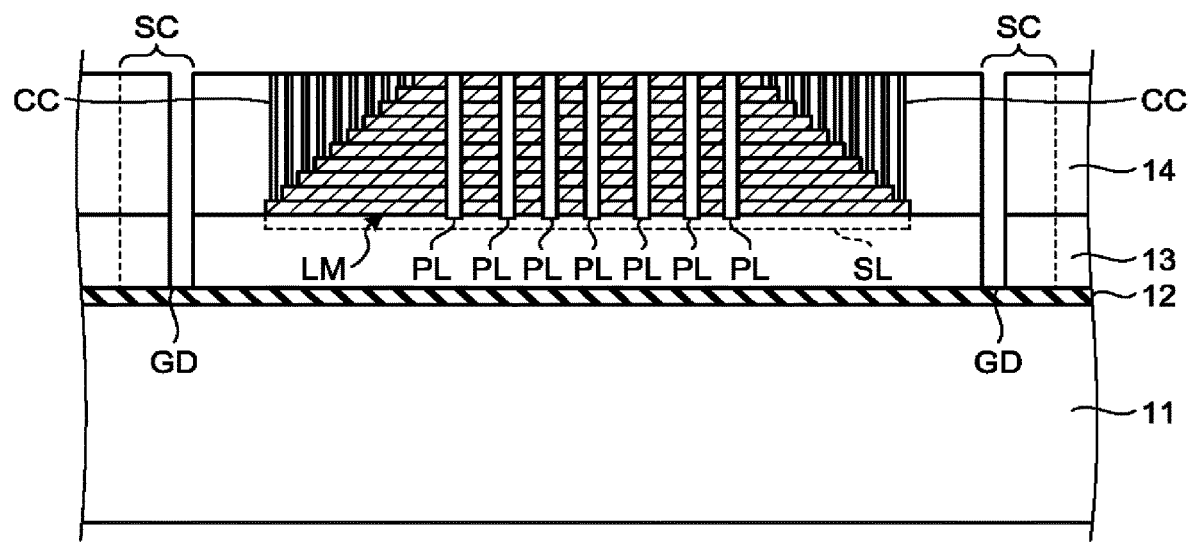

As illustrated in FIG. 5B, contacts CC are formed on the individual steps of the stepwise multilayer element LMg. The contacts CC are to be connected to the individual conductive layers.

Figure 6A:
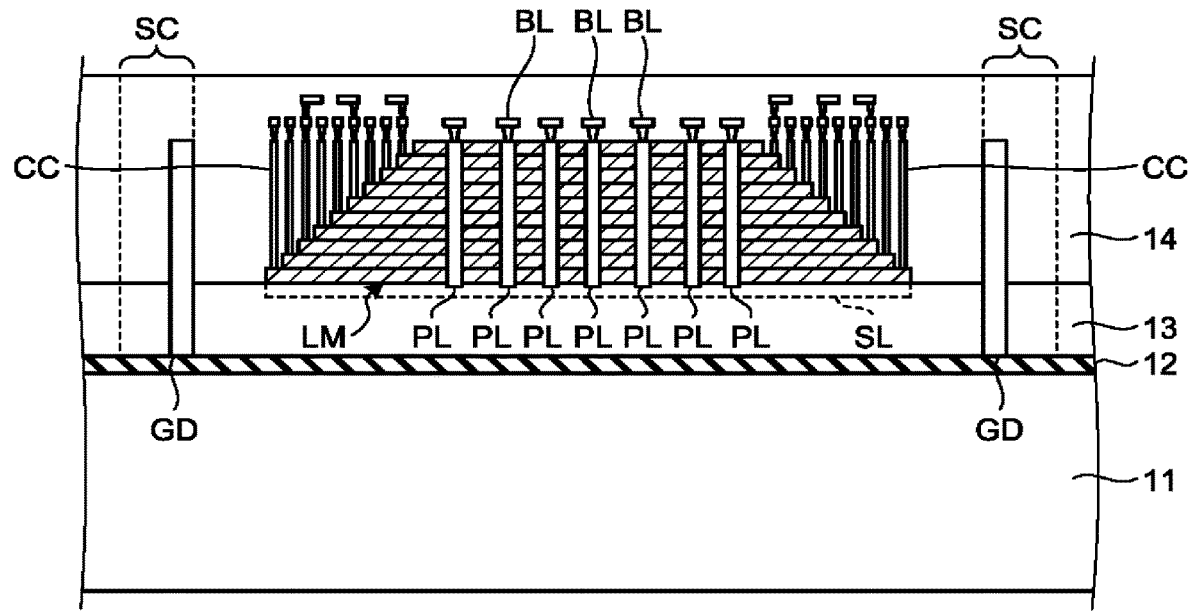
FIG. 6A and FIG. 6B are flow diagrams of an exemplary manufacturing process the semiconductor storage device according to the embodiment.

As illustrated in FIG. 6A, bit lines BL are formed to connect to the channel layers of the pillars via plugs, upper layer wiring is formed to connect to the contacts CC via plugs, and the bit lines DL and the upper layer wiring are covered with the insulation layer 14. To form the insulation layer 14, coverage as a film-forming condition is adjusted to prevent the insulation layer 14 from being embedded into the grooves GD. This creates the air gap insulation layers 13 and 14 containing the grooves GD.

Figure 6B:
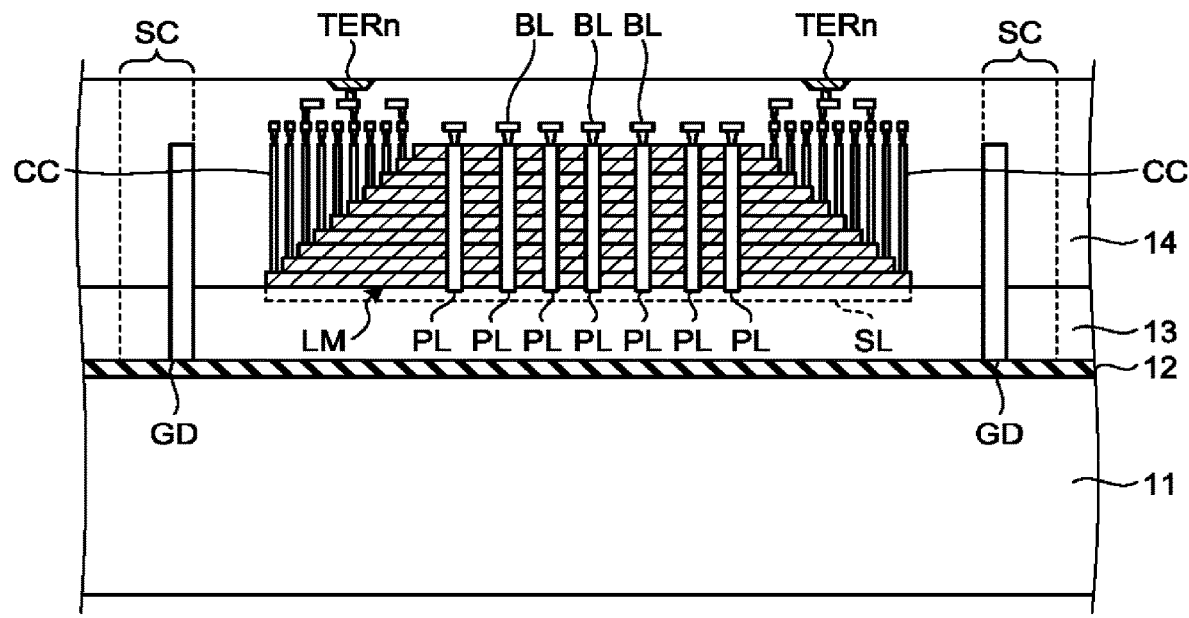

As illustrated in FIG. 6B, connection terminals TERn are formed to be connected with the upper layer wiring of the contacts CC via plugs. Such plugs and connection terminals TERn can be formed, for example, by damascening.

Thereby, the support substrate 11 on which multiple multilayer elements LM connected to the connection terminals TERn are disposed, for example, in a grid form can be obtained.

Figure 7A:
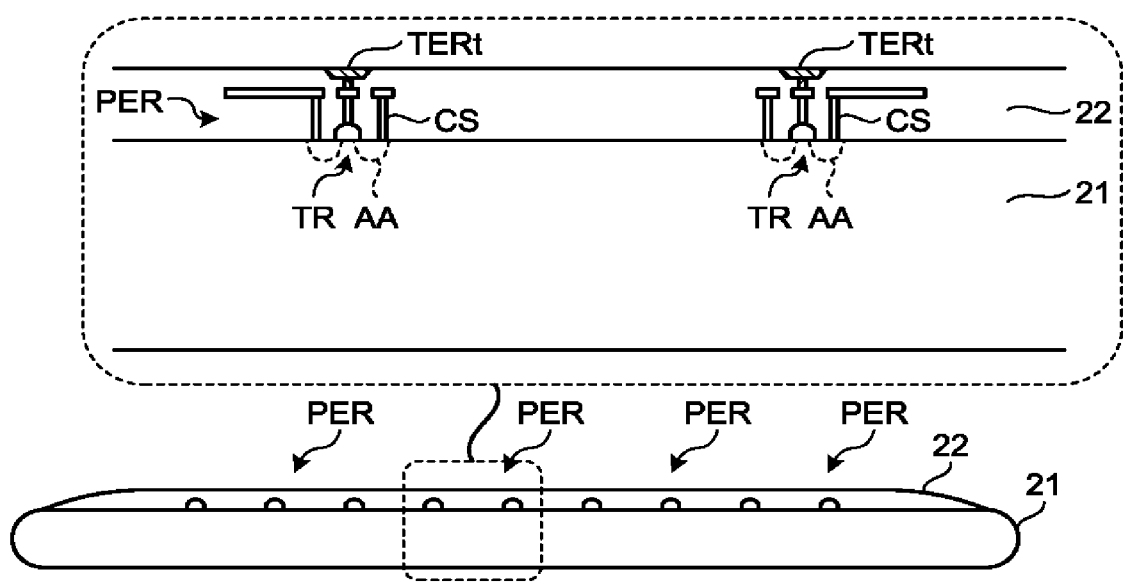
FIG. 7A and FIG. 7B are flow diagrams of an exemplary manufacturing process of the semiconductor storage device according to the first embodiment.

As illustrated in FIG. 7A, a semiconductor substrate 21 such as a silicon substrate is prepared. On the substrate 21, formed are peripheral circuits PER each including a plurality of transistors TR, and connection terminals TERt connected to contacts CS of the transistors TR via upper layer wiring and plugs.

The peripheral circuits PER can be formed, for example, by a general manufacturing method of a semiconductor circuit. For example, the transistors are created by forming gate electrodes on the substrate 21 and forming active regions AA on the surface layer of the substrate 21 in a self-aligned manner.

The substrate 21 on which the peripheral circuits PER connected to the connection terminal TERn are arranged, for example, in a grid form can be obtained. The individual peripheral circuits PER are arranged corresponding to the multilayer elements LM on the support substrate 11.

Figure 7B:
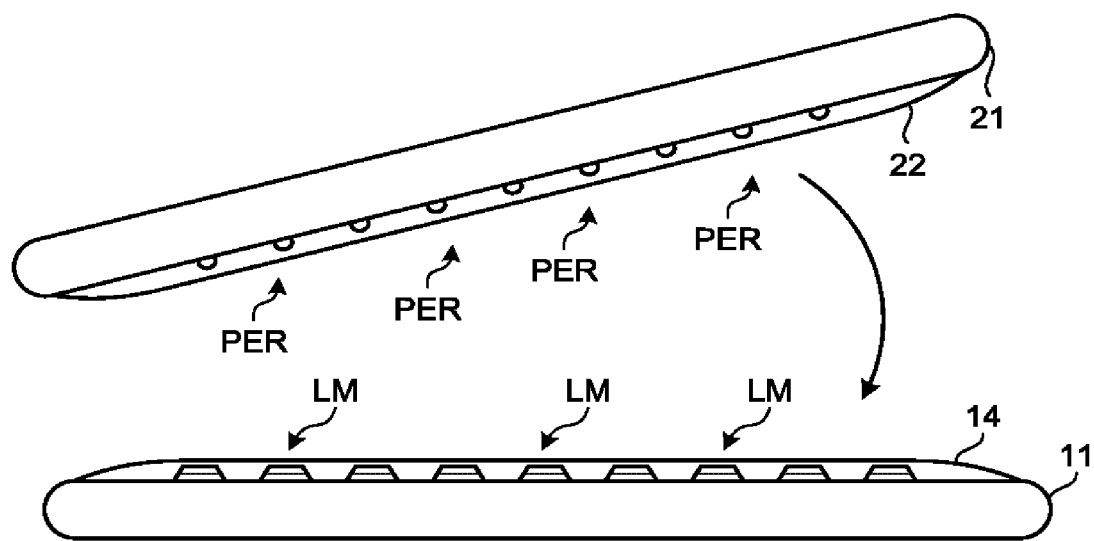

As illustrated in FIG. 7B, the support substrate 11 and the substrate 21 are placed such that the face of the support substrate 11 on which the multilayer elements LM are formed and the face of the substrate 21 on which the peripheral circuits PER are formed oppose each other. The insulation layers 14 and 22 of the support substrate 11 and the substrate 21, and the connection terminals TERn and TERt of the support substrate 11 and the substrate 21 are joined together.

The surfaces of the insulation layers 14 and 22 are pre-activated through plasma treatment to bond the insulation layers 14 and 22 together. The connection terminals TERn and TERt in contact with each other are subjected to annealing and joined together, for example, by Cu—Cu bonding.

Figure 8:
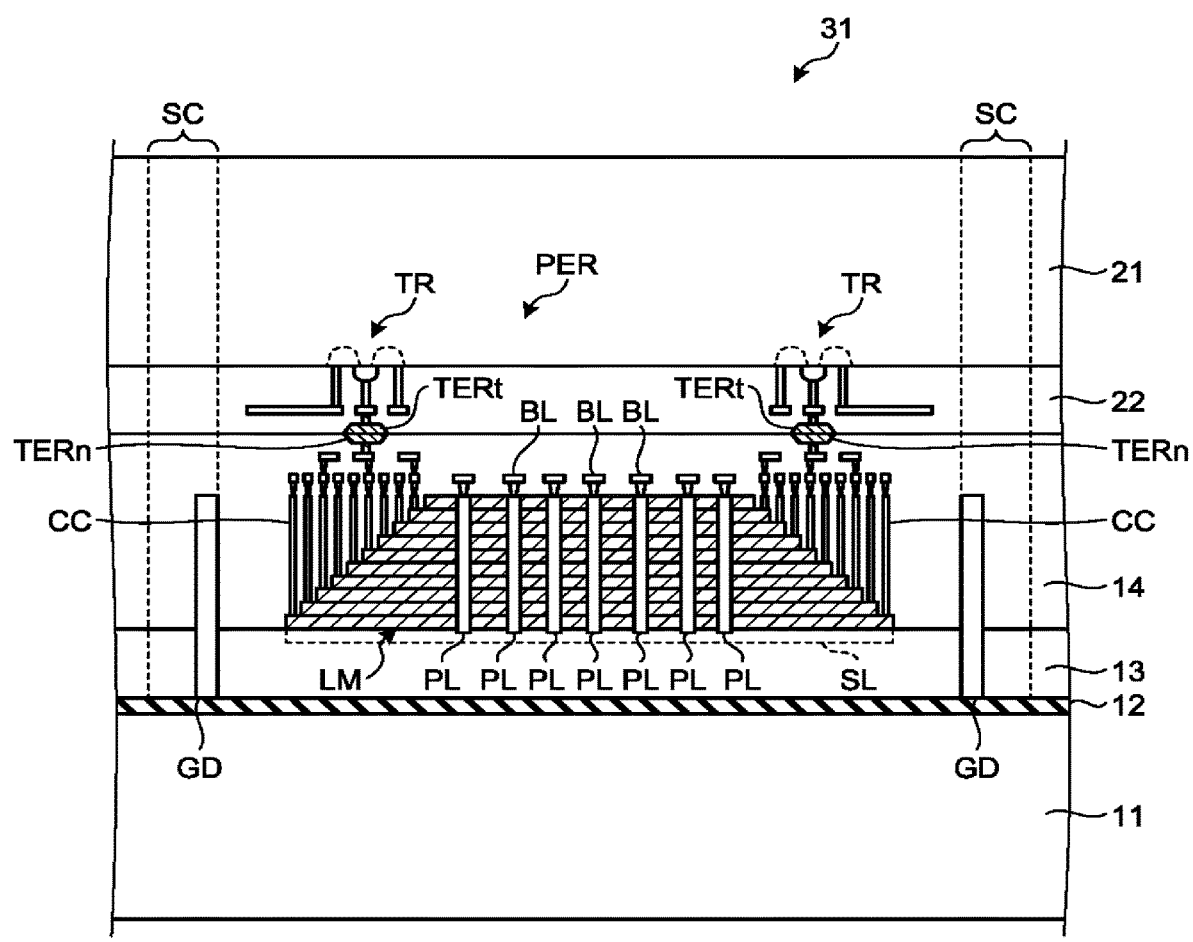
FIG. 8 is a flow diagram of an exemplary manufacturing process of the semiconductor storage device according to the first embodiment.

As illustrated in FIG. 8, a bonded substrate 31 including the joined insulation layers 14 and 22 and the joined connection terminals TERn and TERt is created by the above processing.

Figure 9:
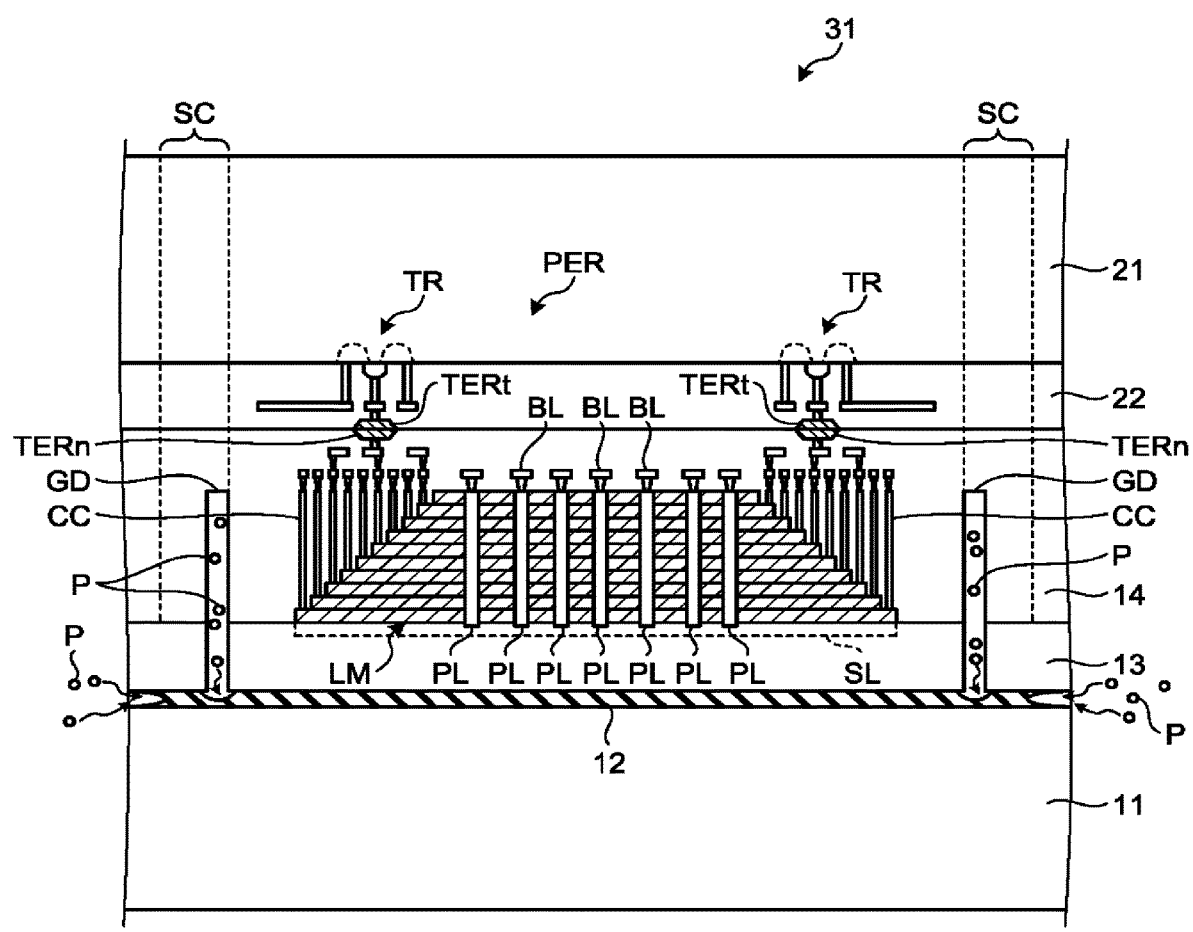
FIG. 9 is a flow diagram of an exemplary manufacturing process of the semiconductor storage device according to the first embodiment.

As illustrated in FIG. 9, an aching gas such as an $O_2$ gas is turned into plasma under low pressure and the bonded substrate 31 is subjected to plasma treatment. Examples of the ashing gas includes an $H_2$ gas, a mixed gas of an $O_2$ gas and an $H_2$ gas, a mixed gas of an $O_2$ gas and an inert gas such as an Ar gas and an $N_2$ gas, in addition to the $O_2$ gas.

By plasma P, the carbon film 12 exposed to the end of the support substrate 11 is gradually removed from the end by ashing. The grooves GD in the insulation layers 13 and 14 communicate with the outside of the insulation layers 13 and 14. The grooves GD serve as introduction paths of the plasma P, to spread the plasma P into the support substrate 11 in a grid form. Thereby, the carbon film 12 is removed by aching from the contact points with the grooves GD.

Figure 10:
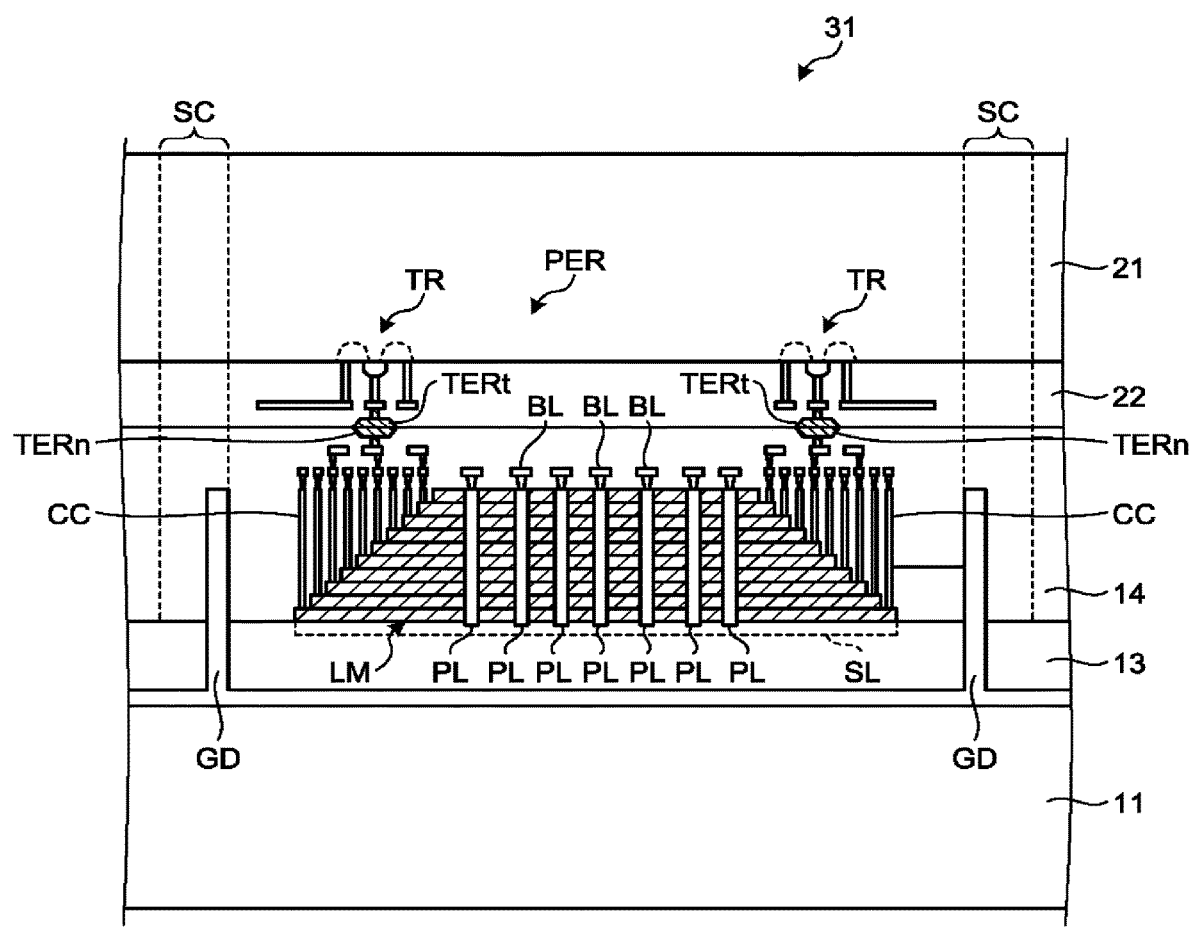
FIG. 10 is a flow diagram of an exemplary manufacturing process of the semiconductor storage device according to the first embodiment.

As illustrated in FIG. 10, the bonded substrate 31 with the carbon film 12 removed from between the support substrate 11 and the insulation layer 13 is created through the above processing. The support substrate 11 is now attached to the insulation layer 13 by electrostatic force.

Figure 11:
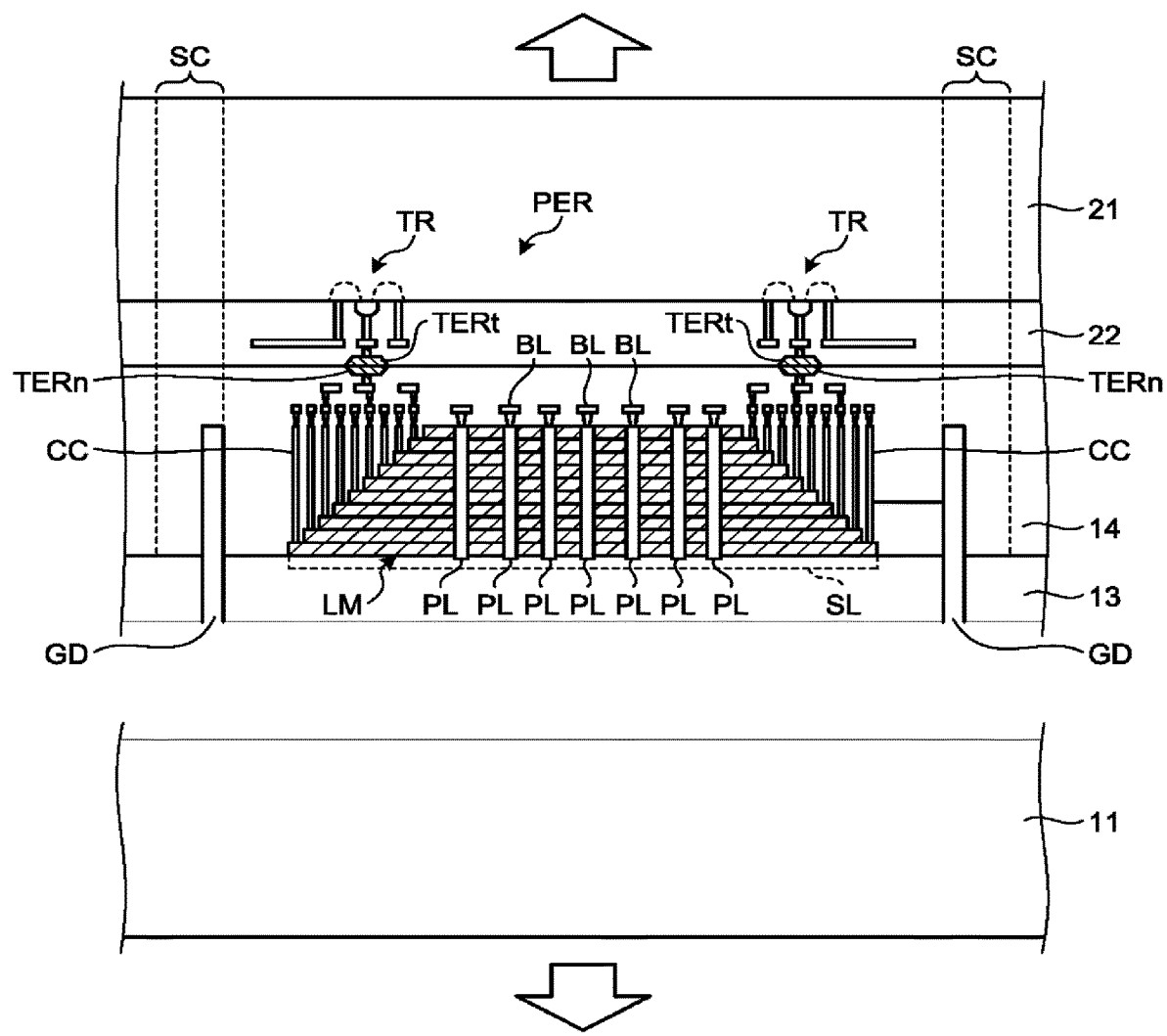
FIG. 11 is a flow diagram of an exemplary manufacturing process of the semiconductor storage device according to the first embodiment.

As illustrated in FIG. 11, the support substrate 11 and the substrate 21 are moved away from each other. The support substrate 11 and the substrate 21 are separated from the boundary between the support substrate 11 and the insulation layer 13, to obtain the support substrate 11 alone and the substrate 21 on which the multilayer elements LM and the peripheral circuits PER are arranged.

To distance the support substrate 11 and the substrate 21 away from each other, the substrate 21 may be moved away from the support substrate 11, the support substrate 11 may be moved away from the substrate 21, or the support substrate 11 and the substrate 21 may be moved away from each other.

The separation between the support substrate 11 and the substrate 21 may be aided by at least one or any combination of injection of gas such as air or an inert gas, injection of liquid such as water, and application of physical force such as vibration and sound wave to an interface between the support substrate 11 and the insulation layer 13.

For at least one of injection of gas, injection of liquid, application of vibration, and application of sound wave, gas, liquid, vibration, or sound wave may be converted into a pulse form. That is, gas or liquid may be injected in a pulsed manner, or vibration or sound wave may be applied in a pulsed manner.

By at least one of these aids, an air gap is likely to occur between the support substrate 11 and the insulation layer 13, facilitating the separation between the support substrate 11 and the substrate 21.

After the separation of the support substrate 11 and the substrate 21, the substrate 21 is diced along the scribe lines SC to manufacture a plurality of semiconductor storage devices 1 each including the cell structure 10 and the semiconductor circuit 20. The support substrate 11 is cleaned when necessary and reused as a recycled substrate.

As described above, the manufacturing process of the semiconductor storage device 1 of the first embodiment ends.

Comparative Example

In a semiconductor storage device for comparison, an insulation layer including a source line is formed directly on a support substrate, for example. A multilayer element including a plurality of conductive layers placed on top of each other via insulation layers is then formed on the insulation layer. After bonding the support substrate with a substrate on which peripheral circuits are formed, the unnecessary support substrate is removed by grinding, for example.

Such a method, however, results in discarding one support substrate every time a semiconductor storage device on one substrate is manufactured. Further, the method requires a large amount of cleaning solution such as ultrapure water for removal of the support substrate by grinding, and causes a large amount of silicon waste from the silicon material of the support substrate. Because of this, the comparative semiconductor storage device may require a great amount of manufacturing cost.

According to the semiconductor storage device 1 of the first embodiment, the multilayer elements LM are formed on the insulation layer 13 formed on the support substrate 11 via the carbon film 12. As described above, the carbon film 12 is easily removable, for example, by plasma ashing. Then, the unnecessary support substrate 11 and the substrate 21 including the multilayer elements LM and the peripheral circuits PER can be physically separated from each other. This enables reuse of the support substrate 11 as a recycled substrate. In addition, no grinding of the support substrate 11 means use of no cleaning solution or occurrence of no silicon waste. Thus, the manufacturing cost of the semiconductor storage device 1 can be reduced.

According to the semiconductor storage device 1 of the first embodiment, the support substrate 11 is not removed by grinding but entirely separated, so that the semiconductor storage device 1 includes no remaining support substrate 11. This makes it possible to decrease the thickness of the lower layer structure of the multilayer element LM and to facilitate the creation of through vias TSV at the time of packaging. The semiconductor storage device 1 contains no remaining film of the support substrate so that a variation in the remaining film thickness would not occur, thereby improving a yield. In addition, decrease in the entire volume of the semiconductor storage device 1 contributes to package saving.

According to the semiconductor storage device 1 of the first embodiment, the carbon film 12 is removed by aching not only from the end of the support substrate 11 but also through the grid-form grooves GD, for example, inside the support substrate 11. This can improve the removal rate of the carbon film 12 and improve the throughput in the manufacturing process of the semiconductor storage device 1.

According to the semiconductor storage device 1 of the first embodiment, the support substrate 11 and the substrate 21 are separated with the aid of injection of gas or liquid or application of vibration or sound wave. This can ensure the separation between the support substrate 11 and the substrate 21.

First Modification

Next, a semiconductor storage device according to a first modification of the first embodiment will be described with reference to FIG. 12 to FIG. 15. FIG. 12 to FIG. 15 are flow diagrams of an exemplary manufacturing process of the semiconductor storage device according to the first modification of the first embodiment. The semiconductor storage device of the first modification is different from that of the first embodiment in that the carbon film 12 is removed through through-holes TH instead of the grooves GD.

Figure 12:
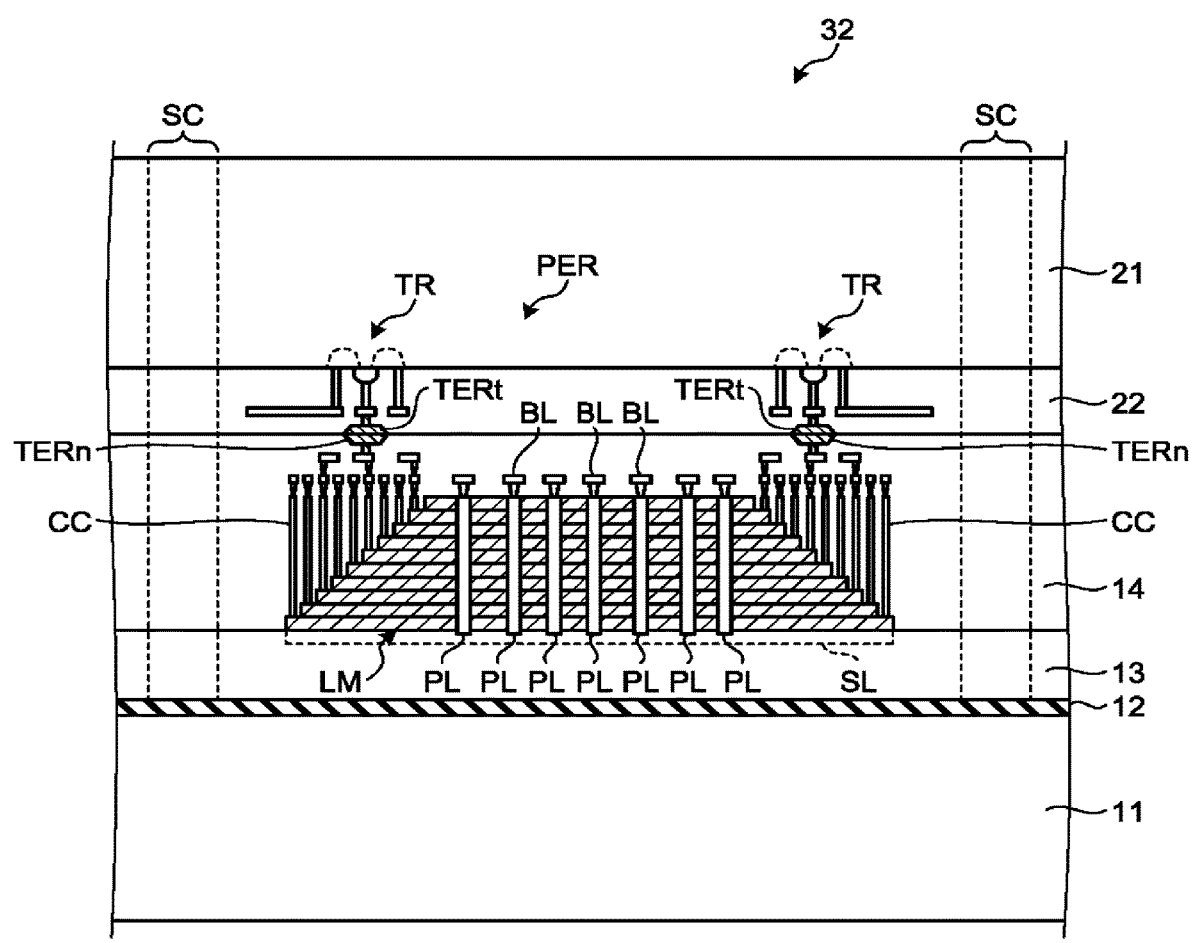
FIG. 12 is a flow diagram of an exemplary manufacturing process of a semiconductor storage device according to a first modification of the first embodiment.

As illustrated in FIG. 12, in the semiconductor storage device of the first modification, a bonded substrate 32 of a support substrate 11 and a substrate 21 is formed without the grooves GD.

Figure 13:
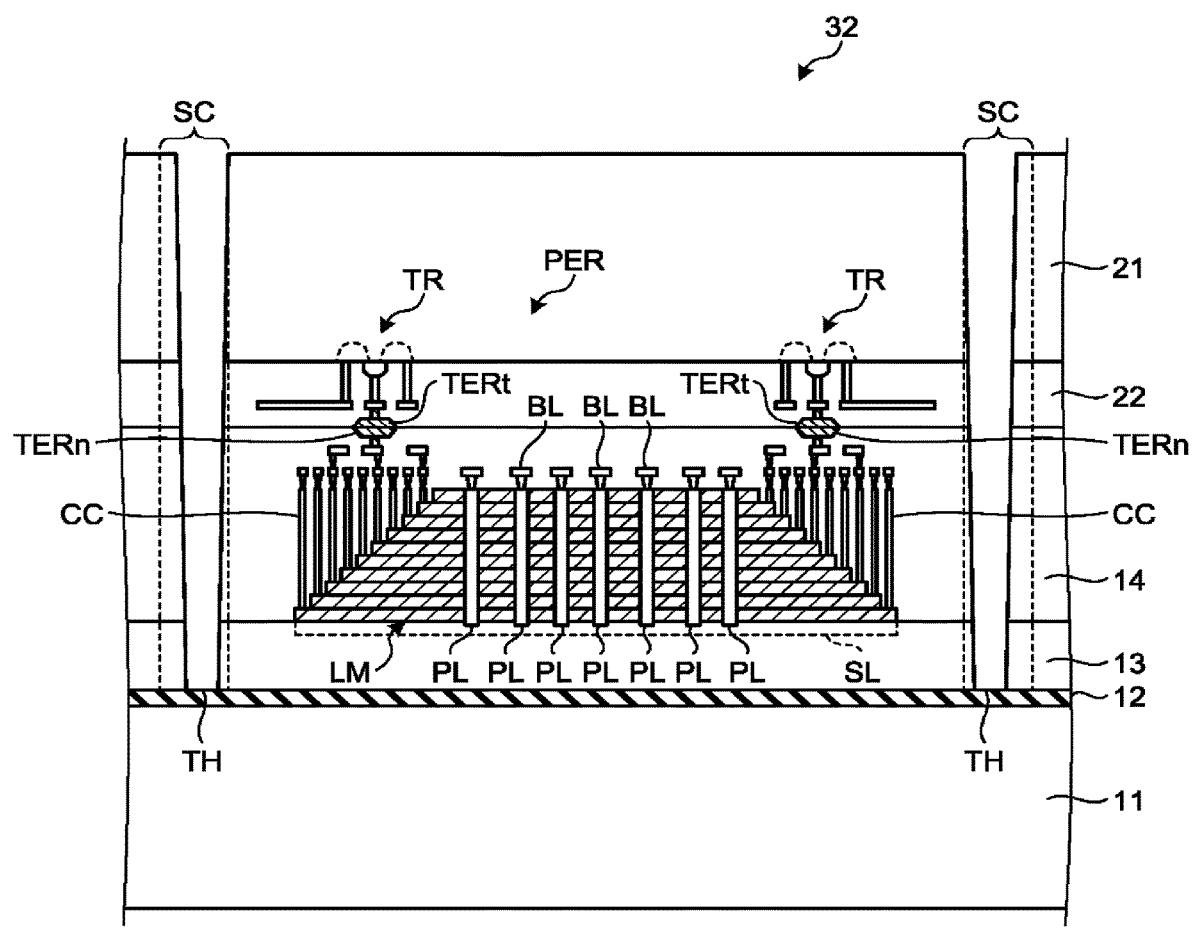
FIG. 13 is a flow diagram of an exemplary manufacturing process of the semiconductor storage device according to the first modification of the first embodiment.

As illustrated in FIG. 13, after creating the bonded substrate 32, the through-holes TH are formed in the regions corresponding to the scribe lines SC. The through-holes TH penetrate through the substrate 21 and the insulation layers 22, 14, and 13 to the carbon film 12, for example. For example, the through-hole TH is formed from the side of the substrate 21 opposite the peripheral circuit PER. It is preferable to create a plurality of through-holes TH in the regions corresponding to the scribe lines SC.

However, the through-hole TH may be formed in a region aside from the scribe lines SC as long as the region exerts no influence on the function of the semiconductor storage device 1.

Figure 14:
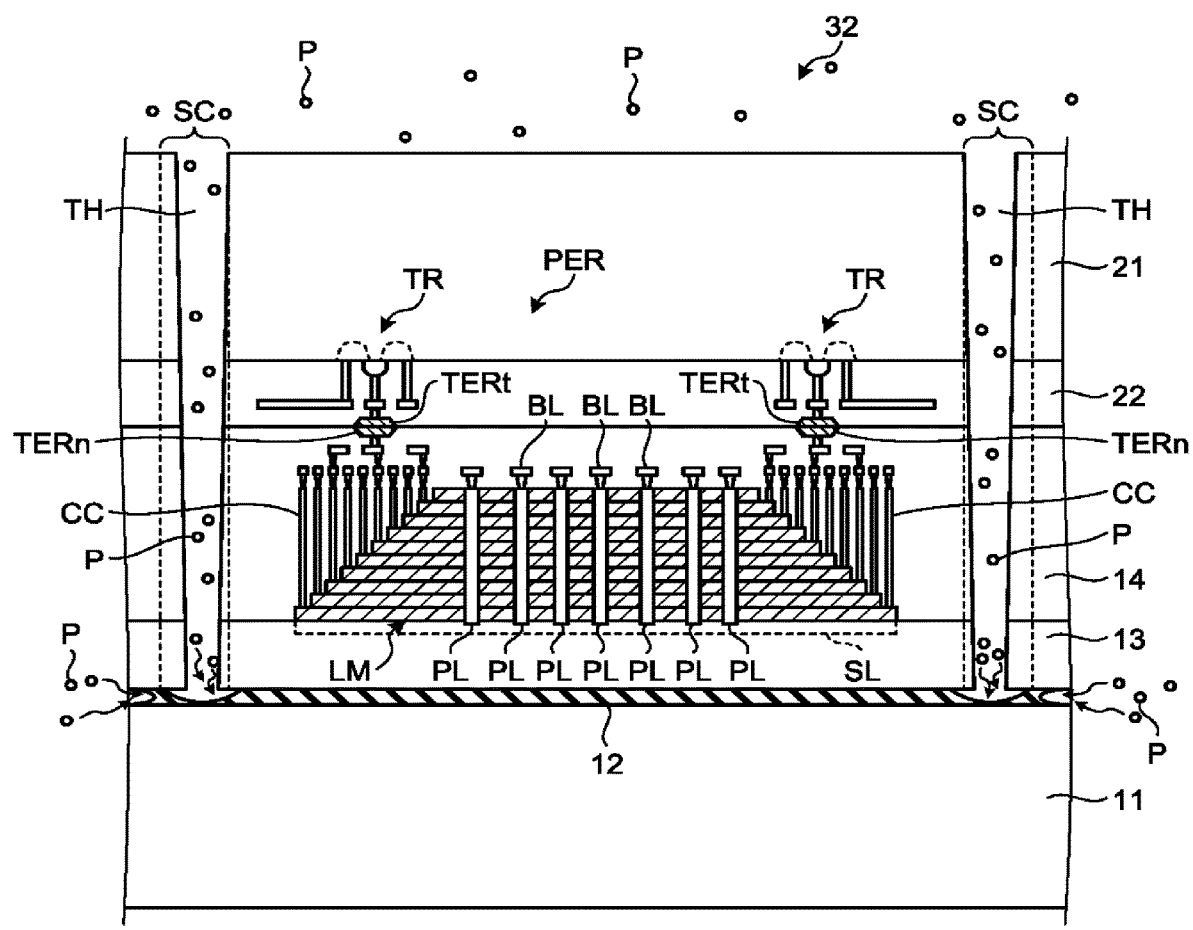
FIG. 14 is a flow diagram of an exemplary manufacturing process of the semiconductor storage device according to the first modification of the first embodiment.

As illustrated in FIG. 14, an ashing gas such as an $O_2$ gas is converted into plasma under low pressure, and the bonded substrate 32 is subjected to plasma treatment. Plasma P enters from the through-holes TH opening to the side of the substrate 21 opposite the peripheral circuit PER. Thus, the carbon film 12 is removed by ashing not only from the end of the support substrate 11 at the end of the carbon film 12 but also from contact points with the bottom of the through-holes TH.

Figure 15:
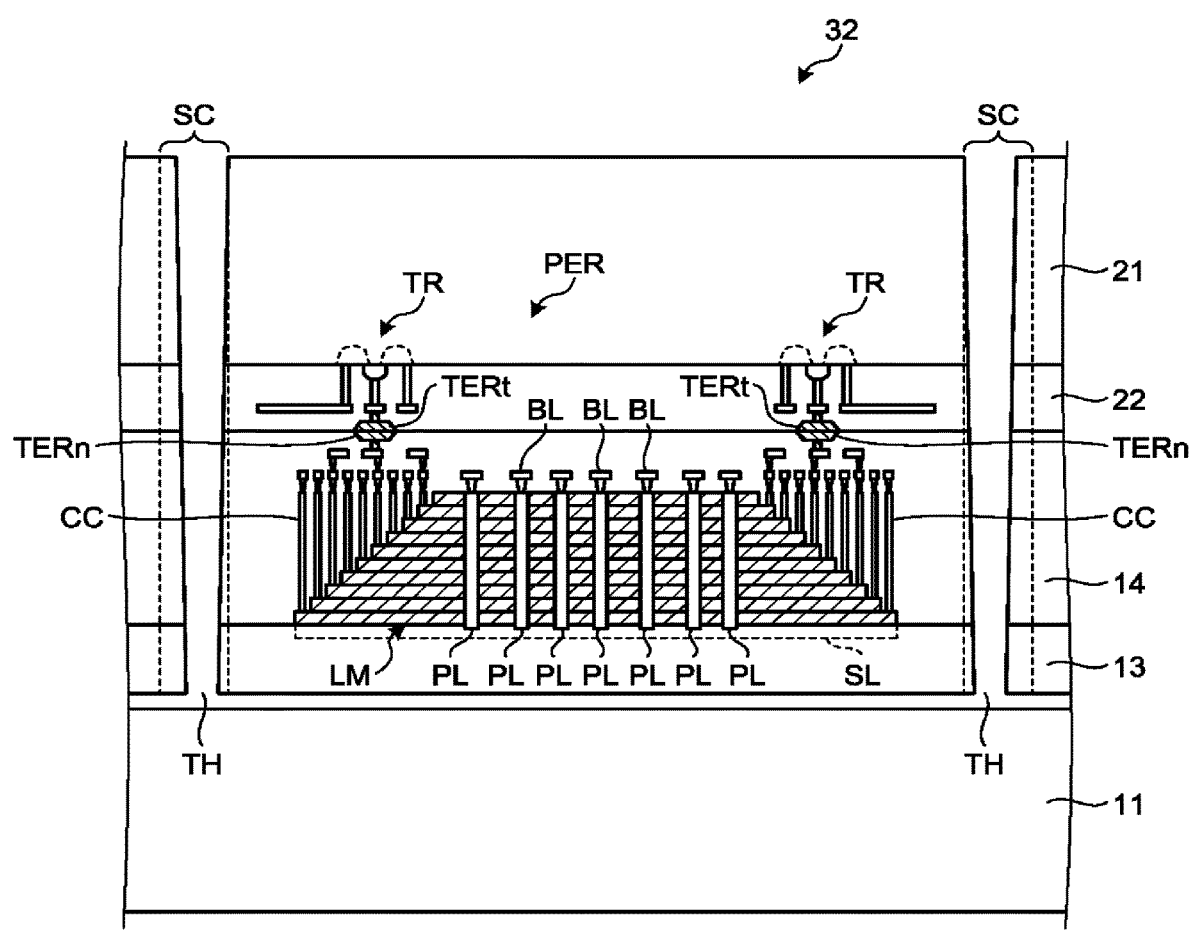
FIG. 15 is a flow diagram of an exemplary manufacturing process of the semiconductor storage device according to the first modification of the first embodiment.

As illustrated in FIG. 15, the bonded substrate 32 with the carbon film 12 removed from between the support substrate 11 and the insulation layer 13 is created by the above processing. The support substrate 11 is now attached to the insulation layer 13 by electrostatic force.

Subsequently, the support substrate 11 and the substrate 21 are separated, and the substrate 21 is diced to form the semiconductor storage device of the first modification through the same or similar procedure as in the first embodiment.

The semiconductor storage device of the first modification attains same or similar effects, as the semiconductor storage device 1 of the first embodiment.

Second Modification

Figure 16:
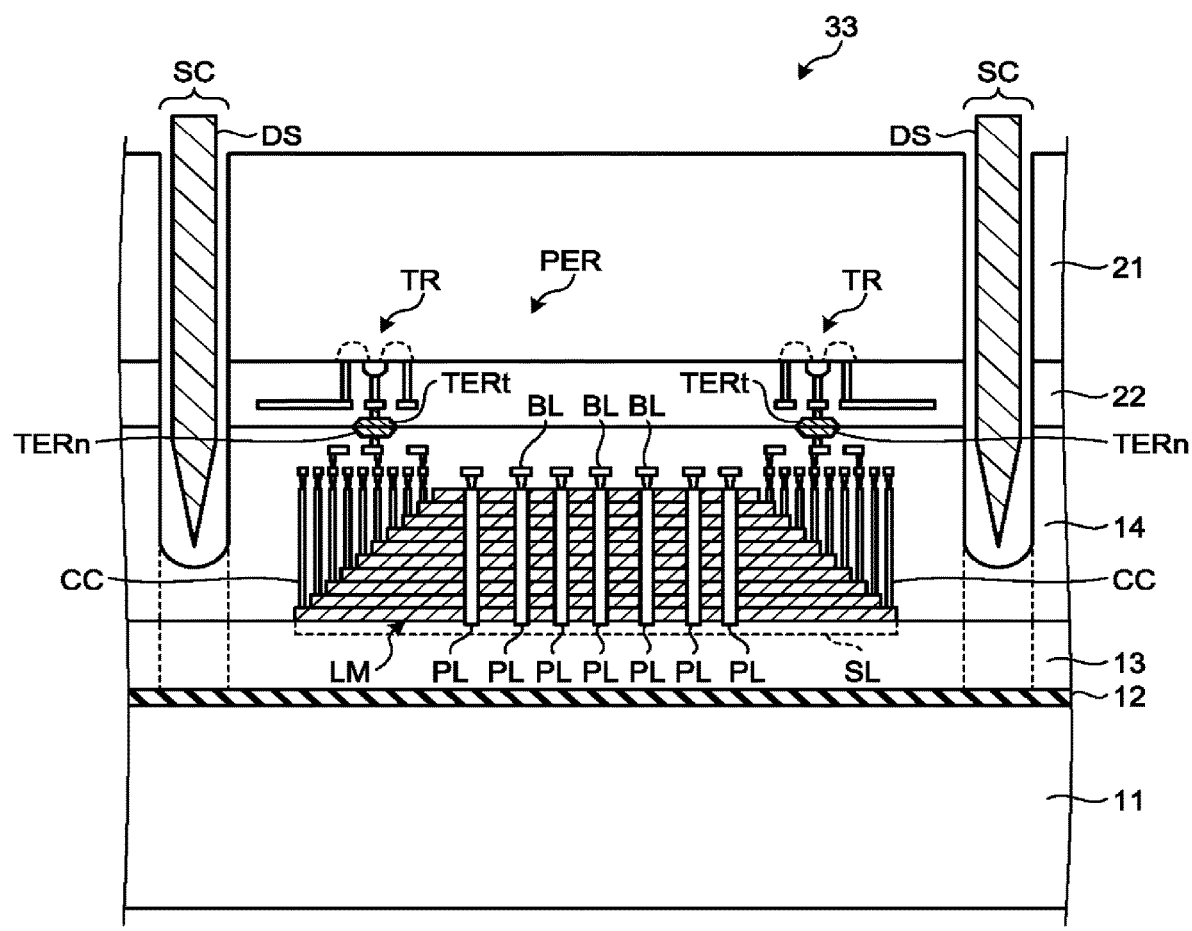
FIG. 16 is a flow diagram of an exemplary manufacturing process of a semiconductor storage device according to a second modification of the first embodiment.
Figure 17:
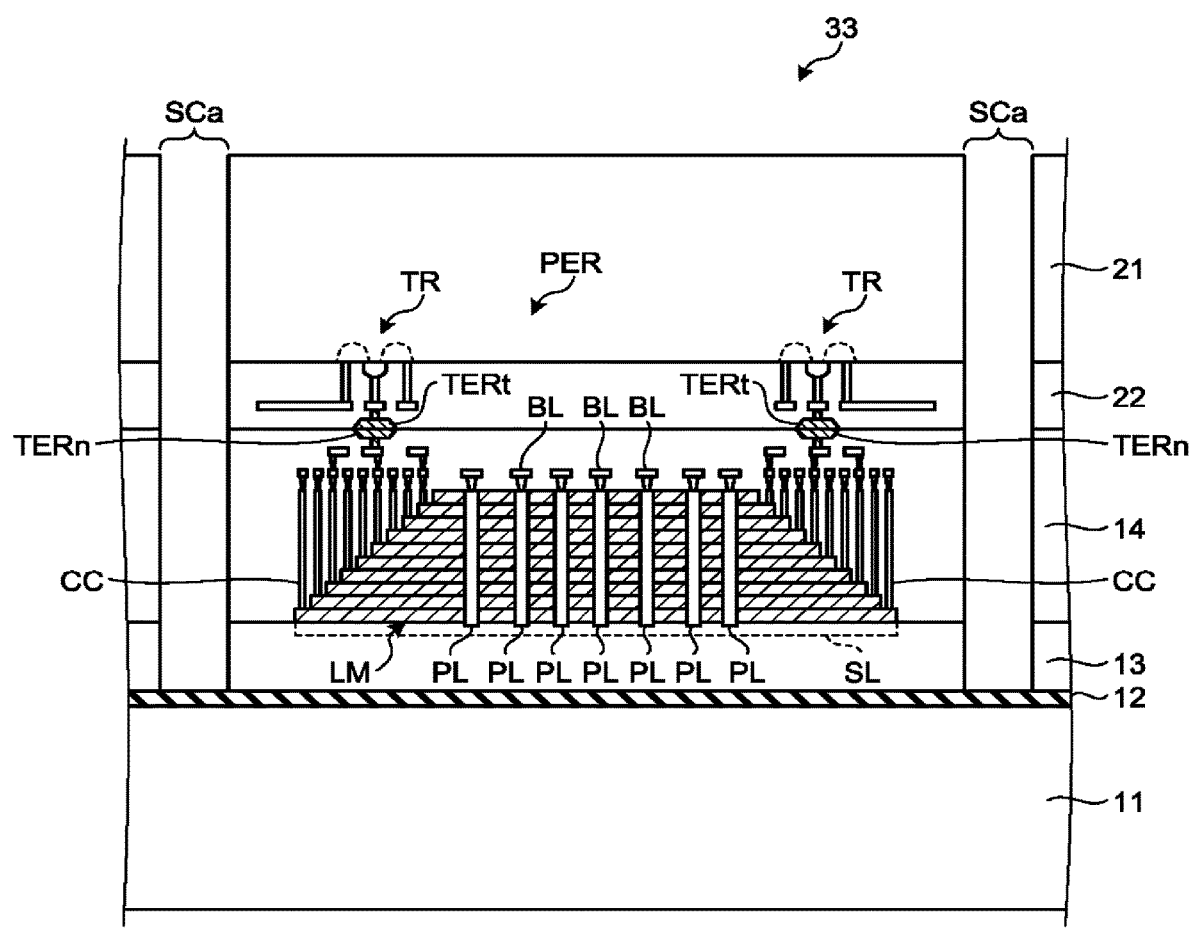
FIG. 17 is a flow diagram of an exemplary manufacturing process of the semiconductor storage device according to the second modification of the first embodiment.

Next, a semiconductor storage device of a second modification of the first embodiment will be described with reference to FIG. 16 and FIG. 17. FIG. 16 and FIG. 17 are flow diagrams of an exemplary manufacturing process of the semiconductor storage device according to the second modification of the first embodiment. The semiconductor storage device of the second modification is different front that of the first embodiment in that the carbon film 12 is removed along the scribe lines a after dicing, in place of the grooves GD.

As illustrated in FIG. 16, a bonded substrate 33 of the support substrate 11 and the substrate 21 with no grooves GD is diced along the scribe lines SC till the carbon film 12, for example, with a dicing saw DS.

As illustrated in FIG. 17, the diced, bonded substrate 33 with the scribe lines SCa extending to the carbon film 12 is obtained. In plasma treatment of such a bonded substrate 33, plasma enters from the scribe lines SCa opening to the side of the substrate 21 opposite the peripheral circuit PER, and the carbon film 12 is removed by ashing not only from the end of the support substrate 11 at the end of the carbon film 12 but also from contact points with the bottom of the scribe lines SCa.

Subsequently, the support substrate 11 and the substrate 21 are separated to create the semiconductor storage device of the second modification through the same or similar procedure as in the first embodiment.

Figure 18:
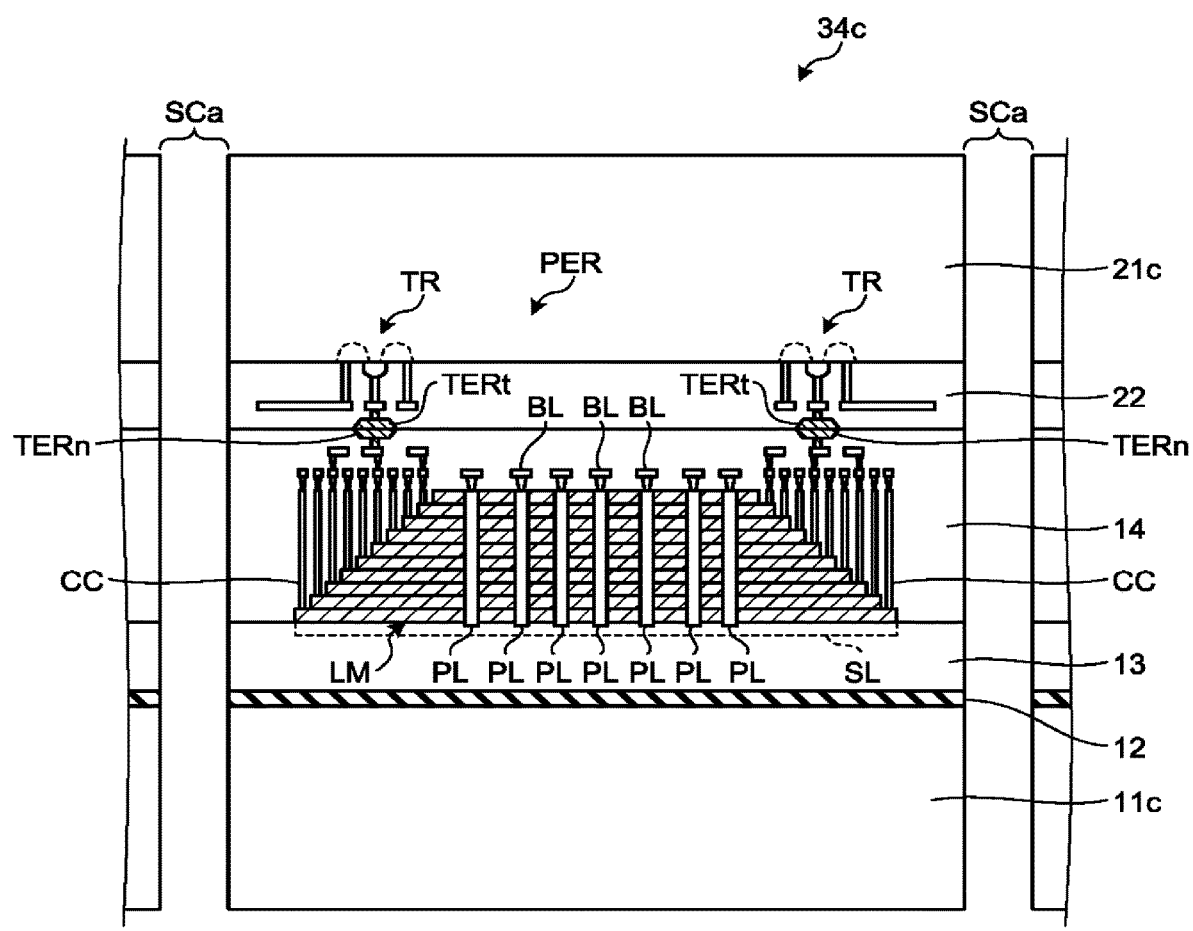
FIG. 18 is a flow diagram of an exemplary manufacturing process of a semiconductor storage device according to a third modification of the first embodiment.
Figure 19:
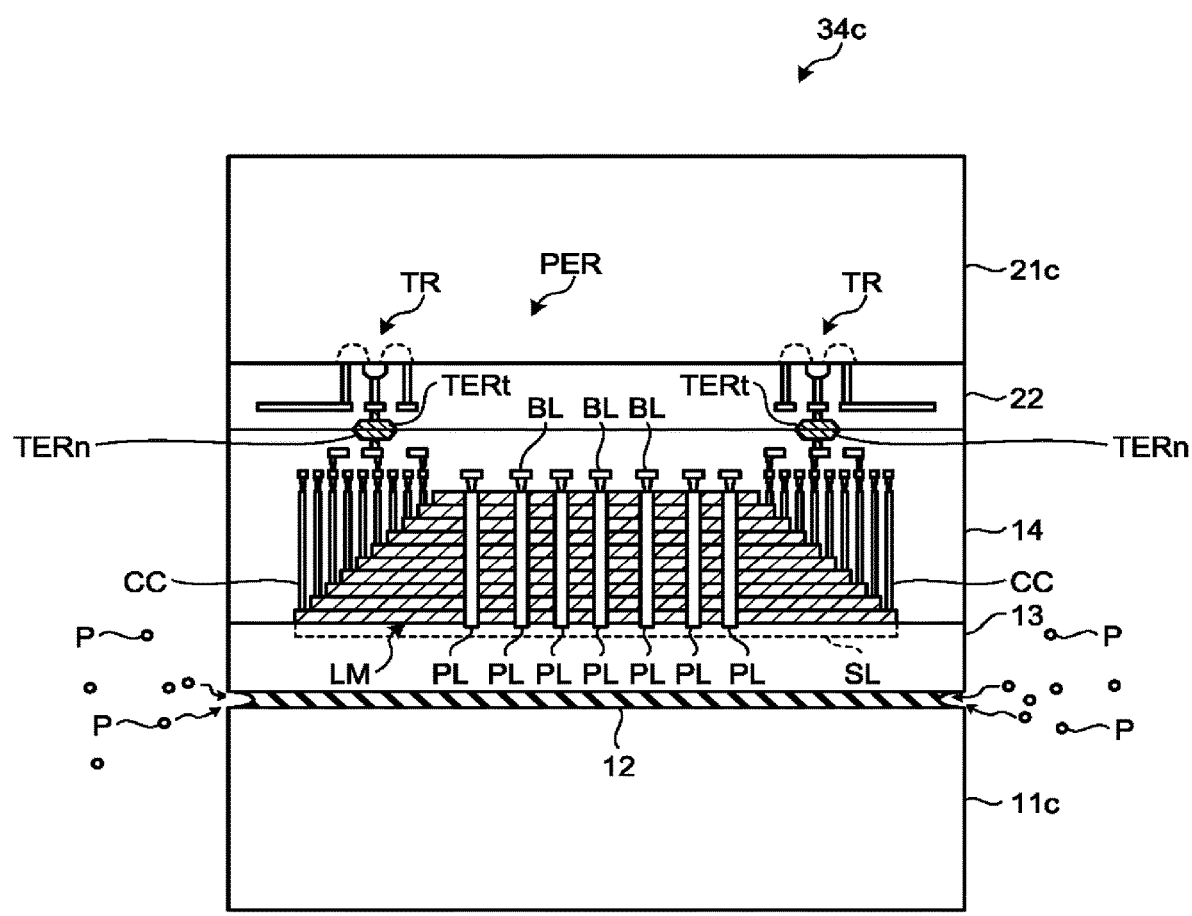
FIG. 19 is a flow diagram of an exemplary manufacturing process of the semiconductor storage device according to the third modification of the first embodiment.

The semiconductor storage device of the second modification attains same or similar effects, as the semiconductor storage device 1 of the first embodiment, Third Modification Next, a semiconductor storage device of a third modification of the first embodiment will be described with reference to FIG. 18 and FIG. 19. FIG. 18 and FIG. 19 are flow diagrams of an exemplary manufacturing process of the semiconductor storage device according to the third modification of the first embodiment. The semiconductor storage device of the third modification is different from that of the first embodiment in that the carbon film 12 is removed after dicing.

As illustrated in FIG. 18, a bonded substrate 34c of the support substrate 11 and the substrate 21 with no grooves GD is completely diced along the scribe lines SC with a dicing saw or a laser, for example. This creates bonded chips 34c each including a support base 11c of chip form and a base 21c of chip form.

As illustrated in FIG. 19, an ashing gas such as an $O_2$ gas is converted into plasma under low pressure and the bonded chips 34c are subjected to plasma treatment. The bonded chips 34c are separated, so that the carbon film 12 can be removed at a sufficient removal rate by ashing starting from only the end of the carbon film 12a exposed from the end of the support base 11c.

According to the third modification, the chip-form semiconductor storage device with the carbon film 12 removed from the chip-form support base 11c can be manufactured. No grinding of the support substrate means use of no cleaning solution or occurrence of no silicon waste in the manufacturing process. The chip-form support base 11c is maintained at high purity, so that it can be melted to be a new silicon substrate for reuse, for example.

The first embodiment and the first to third modifications have described the example of removing the carbon film 12 by plasma ashing, for example. However, they are not limited to such an example. The carbon film may be removed by wet etching with a chemical solution such as thinner.

Second Embodiment

The bonded substrates 31 to 33 of the first embodiment and the first and second modifications may be separated with a substrate separation apparatus. Depending on the structure, the substrate separation apparatus is usable for separating the bonded chip 34c of the third modification. A second embodiment will describe a substrate separation apparatus used for the bonded substrates 31 to 33 with reference to FIG. 20 to FIG. 23.

Exemplary Structure of Substrate Separation Apparatus

Figure 20:
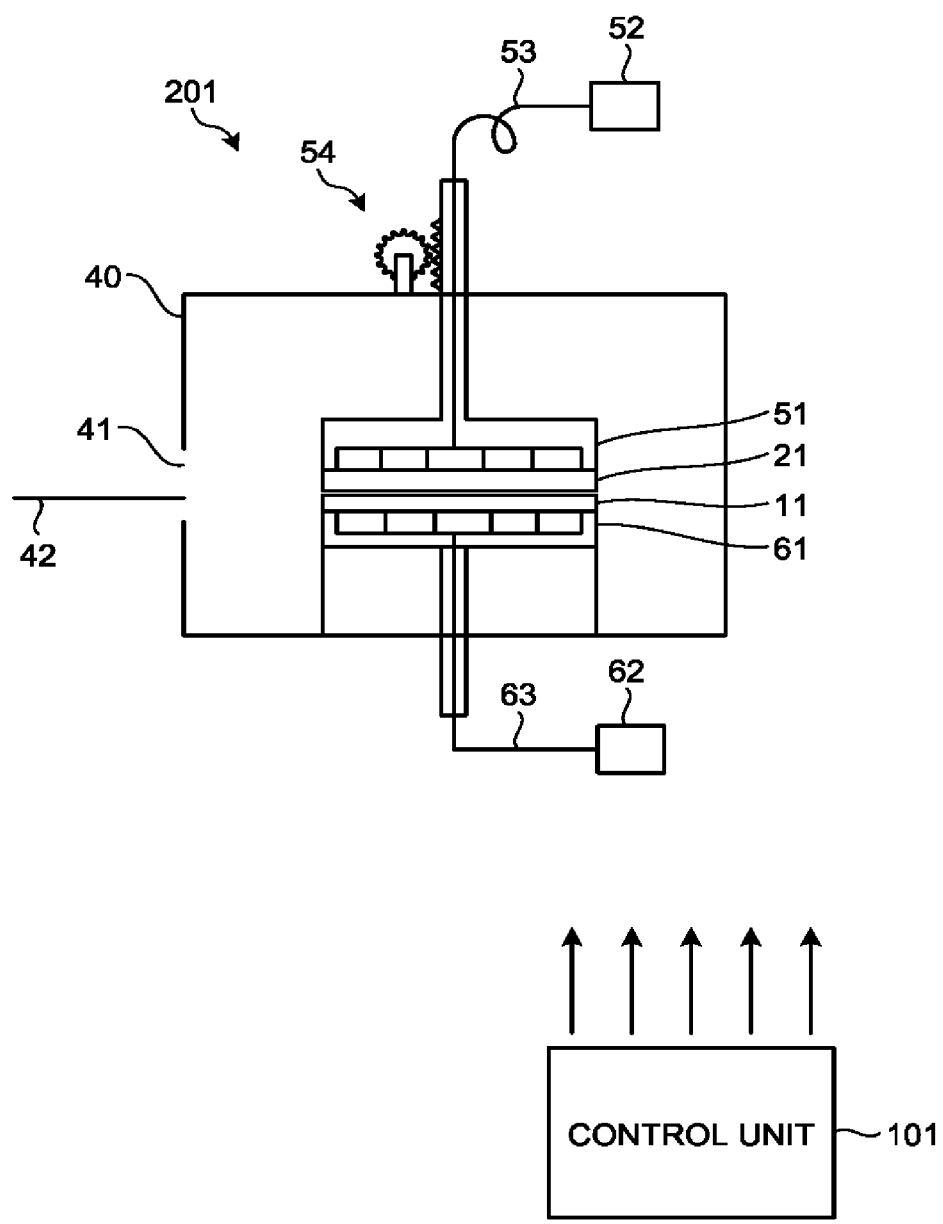
FIG. 20 is a sectional view illustrating an exemplary structure of a substrate separation apparatus according to a second embodiment.

FIG. 20 is a sectional view illustrating an exemplary structure of a substrate separation apparatus 201 according to the second embodiment. As illustrated in FIG. 20, the substrate separation apparatus 201 includes a treatment container 40, a vacuum chuck 61 as a first holder or a mount placed in the treatment container 40, a vacuum chuck 51 as a second holder or a mount placed in the treatment container 40, and a control unit 101 that controls the respective elements.

The treatment container 40 is, for example, a box-shaped container to house the bonded substrates 31 to 33. At least one sidewall of the treatment container 40A is provided with a conveyance entrance and exit 41 including a shutter (not illustrated). The substrate separation apparatus 201 includes a delivery arm 42 that delivers the bonded substrates 31 to 33 to and from the treatment container 40, in the vicinity of the conveyance entrance and exit 41 outside the treatment container 40.

The vacuum chuck 61 is located in approximately the bottom center of the treatment container 40. The vacuum chuck 61 has a flat face to be able to hold the support substrate 11 of each of the bonded substrates 31 to 33, for example. The vacuum chuck 61 is connected to a pump 62 such as a dry pump via vacuum piping 63.

By operation of the pump 62, the rear surface of the support substrate 11 is vacuated and adsorbed onto the vacuum chuck 61, whereby the support substrate 11 or the whole bonded substrate 31, 32, or 33 can be held on the vacuum chuck 61. The support substrate 11 or each bonded substrate 31, 32, or 33 is held, facing the vacuum chuck 51 above the vacuum chuck 61.

The pump 62 and the vacuum piping 63 serve as a first vacuum adsorption mechanism that vacuum-adsorbs the support substrate 11.

The vacuum chuck 51 is placed on approximately the top center of the treatment container 40, facing the vacuum chuck 61. The vacuum chuck 51 has a flat face to be able to hold the substrate 21 of each bonded substrate 31, 32, or 33, for example. The vacuum chuck 51 is connected to a pump 52 such as a dry pump via vacuum piping 53.

By operation of the pump 52, the rear surface of the substrate 21 is vacuated and adsorbed onto the vacuum chuck 51, whereby the substrate 21 or the whole bonded substrate 31, 32, or 33 can be held on the vacuum chuck 51. The substrate 21 or the bonded substrate 31, 32, or 33 is held, facing the vacuum chuck 61 below the vacuum chuck 51.

The vacuum chuck 51 is equipped with a vertical drive motor 54 that vertically drives the vacuum chuck 51. By driving the vertical drive motor 54, the vacuum chuck 51 is vertically moved while the substrate 21 or the bonded substrate 31, 32, or 33 is held thereon, for example.

The pump 52 and the vacuum piping 53 serve as a second vacuum adsorption mechanism that vacuum-adsorbs the substrate 21.

The control unit 101 controls the whole substrate separation apparatus 201 including the delivery arm 42, the pumps 52 and 62, and the vertical drive motor 54. The control unit 101 controls these elements to separate each of the bonded substrates 31 to 33. The following will describe the separation process of the bonded substrates to 33. In the following the respective elements are operated under the control of the control unit 101.

The delivery arm 42 conveys any of the bonded substrates 31 to 33 from the conveyance entrance and exit 41 to the treatment container 40 and places it on the vacuum chuck 61 with the support substrate 11 facing the vacuum chuck 61, for example. The pump 62 is operated to hold the support substrate 11 of any of the bonded substrates 31 to 33 on the vacuum chuck 61.

The vertical drive motor 54 is operated to lower the vacuum chuck 51 toward the vacuum chuck 61 until it comes into contact with the substrate 21 of the any of the bonded substrates 31 to 33, for example. By operation of the pump 52, the substrate 21 of any of the bonded substrates 31 to 33 is held on the vacuum chuck 51. By operation of the vertical drive motor 54, the vacuum chuck 51 is raised away from the vacuum chuck 61.

Thereby, the substrate 21 is separated from the support substrate 11. That is, any of the bonded substrates 31 to 33 is separated into the support substrate 11 and the substrate 21 while the support substrate 11 is held on the vacuum chuck 61 and the substrate 21 is held on the vacuum chuck 51.

To separate the bonded substrates 31 to 33, an auxiliary mechanism (not illustrated) for applying physical force may be placed inside the treatment container 40 to inject gas or liquid or apply vibration or sound wave for the purpose of aiding the separation, as described above.

The second embodiment has described the example of holding the support substrate 11 on the vacuum chuck 61 and holding the substrate 21 on the vacuum chuck 51. However, the opposite is also possible. The second embodiment has described the example of moving the substrate 21 away from the support substrate 11 to separate the two substrates. However, the support substrate 11 may be moved away from the substrate 21, or the two substrates may be moved away from each other.

First Modification

Figure 21:
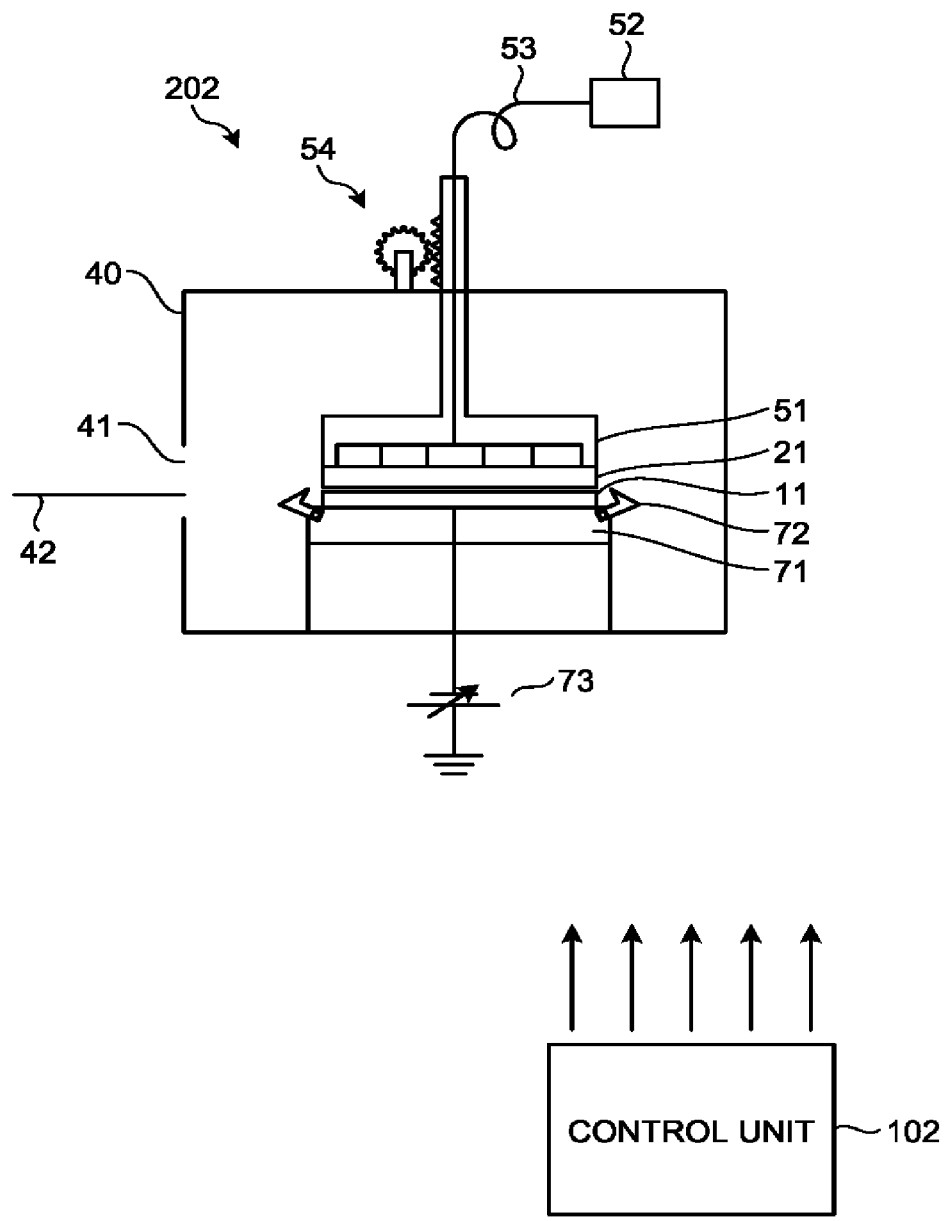
FIG. 21 is a sectional view illustrating an exemplary structure of a substrate separation apparatus according to a first modification of the second embodiment.

Next, a substrate separation apparatus 202 of a first modification of the second embodiment will be described with reference to FIG. 21. FIG. 21 is a sectional view illustrating an exemplary structure of the substrate separation apparatus 202 according to the first modification of the second embodiment. The substrate separation apparatus 202 of the first modification differs from the second embodiment in the holding mechanism for the support substrate 11.

As illustrated in FIG. 21, the substrate separation apparatus 202 includes a stage 71 as a first holder including a hook 72 to hold the support substrate 11. The stage 71 has a flat face to be able to support the support substrates 11 of the bonded substrates 31 to 33, for example.

Hooks 72 are arranged in two or more locations at the end of the stage 71, for example. The hooks 72 are each provided with a drive motor (not illustrated). The drive motor is connected to a drive power supply 73. The drive motor is driven by power-on of the drive power supply 73, to place the hook 72 in a closed state to hold the support substrate 11 on the stage 71.

A control unit 102 controls the whole substrate separation apparatus 202 including a delivery arm 42, a pump 52, a vertical drive motor 54, the drive motor, and the drive power supply 73. The control unit 102 controls these elements to separate the bonded substrates 31 to 33. The separation method of the bonded substrates 31 to 33 is the same as the one in the second embodiment except that the support substrate 11 is held on the stage 71 with the hooks 72.

The substrate separation apparatus 202 may also include an auxiliary mechanism that applies physical force to aid the separation of each of the bonded substrates 31 to 33.

The substrate separation apparatus 202 may move the support substrate 11 away from the substrate 21, instead of moving the substrate 21 away from the support substrate 11, and may move the two substrates away from each other.

Second Modification

Figure 22:
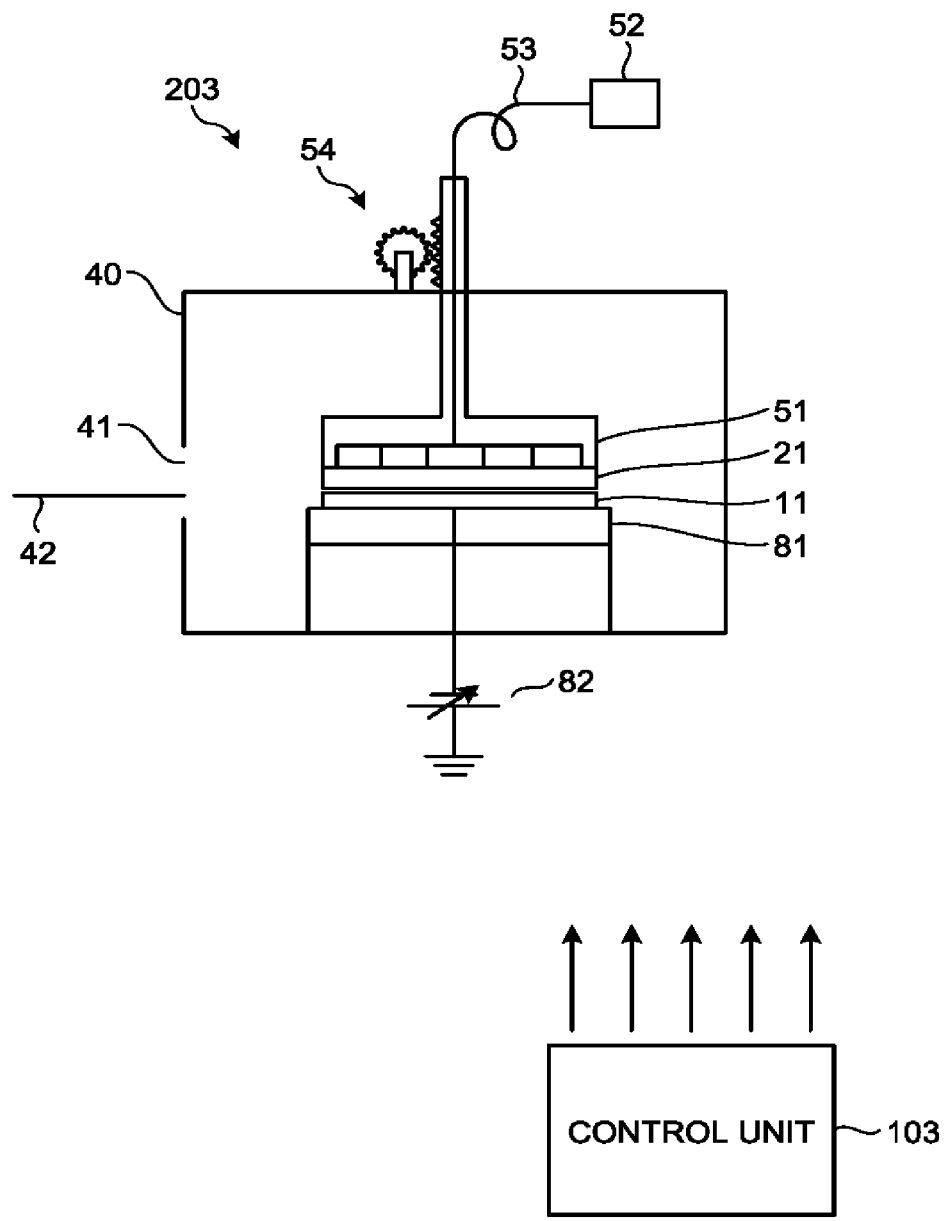
FIG. 22 is a sectional view illustrating an exemplary structure of a substrate separation apparatus according to a second modification of the second embodiment.

Next, a substrate separation apparatus 203 of a second modification of the second embodiment will be described with reference to FIG. 22. FIG. 22 is a sectional view illustrating an exemplary structure of a substrate separation apparatus 203 according to the second modification of the second embodiment. The substrate separation apparatus 203 of the second modification differs from the second embodiment in the holding mechanism for the support substrate 11.

As illustrated in FIG. 22, the substrate separation apparatus 203 includes an electrostatic chuck 81 as a first holder to hold the support substrate 11. The electrostatic chuck 81 has a flat face to be able to hold the support substrates 11 of the bonded substrates 31 to 33, for example. The electrostatic chuck 81 is connected to a DC power supply 82 that charges the mount surface of the electrostatic chuck 81. By power-on of the DC power supply 82 the surface of the electrostatic chuck 81 on which the support substrate 11 is placed is charged, thereby electrostatically adsorbing the support substrate 11 onto the electrostatic chuck 81 to hold the support substrate 11 or any of the whole bonded substrates 31 to 33 on the electrostatic chuck 81.

The DC power supply 82 serves as a first electrostatic adsorption mechanism that electrostatically adsorbs the support substrate 11.

A control unit 103 controls the whole substrate separation apparatus 203 including a delivery arm 42, a pump 52, a vertical drive motor 54, and the DC power supply 82. The control unit 103 controls these elements to separate each of the bonded substrates 31 to 33. The separation method of the bonded substrates 31 to 33 is the same as the one in the second embodiment except that the support substrate 11 is held on the electrostatic chuck 81 with the electrostatic adsorption mechanism.

The substrate separation apparatus 203 may also include an auxiliary mechanism for applying physical force to aid the separation of the bonded substrates 31 to 33.

The second modification has described the example of holding the support substrate 11 on the electrostatic chuck 81 and holding the substrate 21 on the vacuum chuck 51. However, the opposite is also possible. The electrostatic chuck 61 may hold the support substrate 11 while an electrostatic chuck including a second electrostatic adsorption mechanism may hold the substrate 21, or vice versa.

The second modification has described the example of moving the substrate 21 away from the support substrate 11 to separate the two substrates. However, the support substrate 11 may be moved away from the substrate 21, or the two substrates may be moved away from each other.

Third Modification

Figure 23:
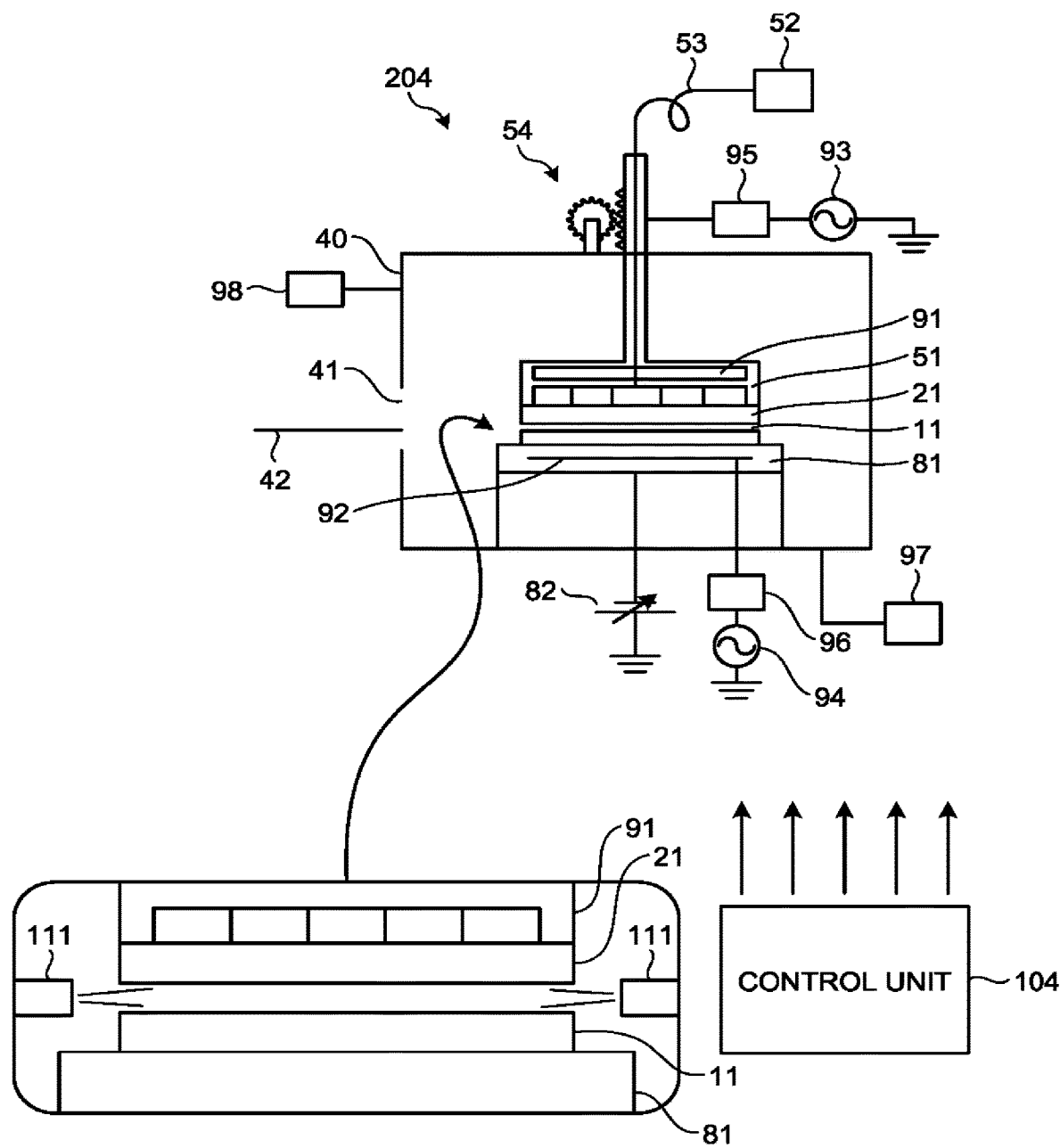
FIG. 23 is a sectional view illustrating an exemplary structure of a substrate separation apparatus according to a third modification of the second embodiment.

Next, a substrate separation apparatus 204 of a third modification of the second embodiment will be described with reference to FIG. 23. FIG. 23 is a sectional view illustrating an exemplary structure of the substrate separation apparatus 204 according to the third modification of the second embodiment. The substrate separation apparatus 204 of the third modification differs from the second modification in that the carbon film 12 is removed before the separation of the bonded substrates 31 to 33.

As illustrated in FIG. 23, the substrate separation apparatus 204 includes a coil 91, an electrode 92, a radio-frequency power supply 93, an AC power supply 94, matching devices 95 and 96, a pump 97, and a gas supply 98, in addition to the elements of the second modification.

The coil 91 is located in the vacuum chuck 51. The coil 91 is connected to the radio-frequency power supply 93 via the matching device 95. Thus, the vacuum chuck 51 functions as an upper electrode.

The electrode 92 is located in the electrostatic chuck 81. The electrode 92 is connected to the AC power supply 94 via the matching device 96. Thus, the electrostatic chuck 81 functions as a lower electrode.

The pump 97 such as a dry pump is connected to the treatment container 40. By operation of the pump 97, the treatment container 40 can be vacuated.

The gas supply 98 is connected to the treatment container 40 and supplies an ashing gas such as an $O_2$ gas, an Ar gas, and an $N_2$ gas into the treatment container 40.

The coil 91, the electrode 92, the radio-frequency power supply 93, the AC power supply 94, and the matching devices 95 and 96 constitute a plasma generation mechanism.

A control unit 104 controls the whole substrate separation apparatus 204 including a delivery arm 42, a pump 52, a vertical drive motor 54, the radio-frequency power supply 93, the AC power supply 94, the matching devices 95 and 96, the pump 97, and the gas supply 98. The control unit 104 controls these elements to separate each of the bonded substrates 31 to 33. The following will describe the separation process of the bonded substrates 31 to 33. In the following the respective elements are operated under the control of the control unit 104.

Any of the bonded substrates 31 to 33 is conveyed into the treatment container 40, and is held, for example, on the electrostatic chuck 81 by electrostatic adsorption of the support substrate 11 of any of the bonded substrates 31 to 33. The vacuum chuck 51 is maintained away from the electrostatic chuck 81.

The pump 97 is operated to lower the pressure inside the treatment container 40, and the gas supply 98 supplies an aching gas into the treatment container 40. Examples of the ashing gas include a mixed gas of an $O_2$ gas, an Ar gas, and an $N_2$ gas. While the matching device 95 performs matching, the radio-frequency power supply 93 applies radio-frequency power to the coil 91 of the vacuum chuck 51. Likewise, while the matching device 96 performs matching, the AC power supply 94 applies AC power to the electrode 92 of the electrostatic chuck 81. Thereby, the aching gas generates plasma between the vacuum chuck 51 and the electrostatic chuck 81. Any of the bonded substrates 31 to 33 held on the electrostatic chuck 81 is subjected to plasma treatment, to remove the carbon film 12 from the support substrate 11 of any of the bonded substrates 31 to 33 by ashing. Subsequently, the application of radio-frequency power to the coil 91 and the application of AC power to the electrode 92 of the electrostatic chuck 81 are stopped.

The vertical drive motor 54 is driven to lower the vacuum chuck 51 toward the electrostatic chuck 81, and the vacuum chuck 51 adsorbs the substrate 21 of any of the bonded substrates 31 to 33 thereto. The vertical drive motor 54 is driven to raise the vacuum chuck 51 away from the electrostatic chuck 81, to separate the support substrate 11 and the substrate 21 of any of the bonded substrates 31 to 33.

The substrate separation apparatus 204 may also include an auxiliary mechanism 111 for applying physical force to aid the separation of any of the bonded substrates 31 to 33.

The third modification has described the example of holding the support substrate 11 on the electrostatic chuck 81 and holding the substrate 21 on the vacuum chuck 51. However, the opposite is also possible. In addition, the support substrate 11 may be held on the electrostatic chuck 81 and the substrate 21 may be held on an electrostatic chuck including a second electrostatic adsorption mechanism, or vice versa.

The third modification has described the example of moving the substrate 21 away from the support substrate 11 to separate the two substrates. However, the support substrate 11 may be moved away from the substrate 21, or the two substrates 21 may be moved away from each other.

Other Embodiment

The first and second embodiments and their modifications have described the memory cell MC including the multilayer element LM joined to the semiconductor circuit 20 by way of example, and they are not limited to such an example. Various structures that do not base on the semiconductor substrate, unlike a transistor formed on the semiconductor substrate and including the substrate surface layer as a part, may be joined to the semiconductor circuit 20 in place of the cell structure 10.

The first and second embodiments and their modifications have described the support substrate 11 being a silicon substrate, by way of example. However, they are not limited to such an example. The support substrate may be, for example, a glass substrate, a quartz substrate, or a ceramic substrate.

The first and second embodiments and their modifications have described the three-dimensional non-volatile memory as the cell structure 10 of the semiconductor storage device 1, by way of example. However, they are not limited to such an example. The semiconductor storage device 1 may include a magnetoresistive random access memory (MRAM) or a phase change memory (PCM) in addition to a NAND flash memory.

That is, by appropriately changing a memory type it is made possible to change memory capacity and interface communication speed. Further, by appropriately selecting a memory generation of the cell structure 10 and a transistor generation of the semiconductor circuit 20 to join to the cell structure 10, it is made possible to rapidly develop a product of a combination suitable for a desired application.

Examples of application include a smartphone including a NAND flash memory, a datacenter including a storage class memory such as an MRAM and a PCM, Internet of things (IoT), automatic driving with a car sensor, a robot, artificial intelligence (AI), and a neuro device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of separating a bonded substrate comprising a first substrate and a second substrate, the bonded substrate comprising:
   a carbon film on a first surface of the first substrate,
   a memory cell on the carbon film,
   a first connection terminal on the memory cell,
   a transistor on a second surface of the second substrate, and
   a second connection terminal on the transistor,
   wherein
   in a formation of the carbon film, a CVD method at a predetermined temperature is used and a formation of the carbon film at the predetermined temperature prevents the carbon film from changing in thickness and quality through heat treatment, and
   in a direction in which the first surface of the first substrate and the second surface of the second substrate oppose each other, a side of the first substrate on which the memory cell is located and a side of the second substrate on which the transistor is located are joined together, and the first connection terminal and the second connection terminal are mutually connected, the method comprising:

removing the carbon film by plasma ashing; and separating the bonded substrate from which the carbon film is removed into the first substrate with the first surface exposed and the second substrate on which the memory cell and the transistor are located.

2. The method according to claim 1, wherein
the second substrate is a semiconductor substrate, and
the transistor includes an active region embedded in the second substrate and exposed to a surface of the second substrate.

3. The method according to claim 1, wherein
the memory cell before removal of the carbon film is covered with an insulation layer,
the memory cell in the insulation layer is surrounded by a scribe line, and
the insulation layer is provided with a groove in a location corresponding to the scribe line, the groove that extends to the carbon film along a depth of the insulation layer and that communicates with an outside of the insulation layer.

4. The method according to claim 1, wherein
when separating the bonded substrate, separating the bonded substrate by holding the first substrate with a first holder, holding the second substrate with a second holder, and distancing the first holder and the second holder away from each other,
the first holder comprising one of a first vacuum chuck, a first electrostatic chuck, and a hook,
the second holder comprising one of a second vacuum chuck and a second electrostatic chuck.

5. The method according to claim 4, wherein
when separating the bonded substrate, separating the bonded substrate with aid of at least one of injection of gas, injection of liquid, application of vibration, and application of sound wave to an interface between the first substrate and the memory cell.

6. The method according to claim 5, wherein
converting at least one of gas, liquid, vibration, and sound wave into pulse form, when the injection or the application to the interface between the first substrate and the memory cell.

7. A method of manufacturing a semiconductor storage device, comprising:

preparing a first substrate;

forming a carbon film on a first surface of the first substrate using a CVD method at a predetermined temperature, the predetermined temperature preventing the carbon film from changing in thickness and quality through subsequent heat treatment;

forming a memory cell on the carbon film;

forming a contact to be connected to the memory cell, and forming a first connection terminal connected to the contact;

forming a transistor on a second surface of a second substrate;

forming a contact to be connected to the transistor and forming a second connection terminal connected to the contact;

forming a bonded substrate joining the first substrate on which the memory cell is formed and the second substrate on which the transistor is formed such that the first connection terminal and the second connection terminal oppose each other, and mutually connecting the first connection terminal and the second connection terminal;

removing the carbon film by plasma ashing; and separating the bonded substrate from which the carbon film is removed into the first substrate with the first surface exposed and the second substrate on which the memory cell and the transistor are located.

8. The method according to claim 7, wherein
the second substrate is a semiconductor substrate, and
the transistor includes an active region embedded in the second substrate and exposed to a surface of the second substrate.

9. The method according to claim 7, wherein
the memory cell before removal of the carbon film is covered with an insulation layer,
the memory cell in the insulation layer is surrounded by a scribe line, and
the insulation layer is provided with a groove in a location corresponding to the scribe line, the groove that extends to the carbon film along a depth of the insulation layer and that communicates with an outside of the insulation layer.

10. The method according to claim 7, wherein
when separating the bonded substrate, separating the bonded substrate by holding the first substrate with a first holder, holding the second substrate with a second holder, and distancing the first holder and the second holder away from each other,
the first holder comprising one of a first vacuum chuck, a first electrostatic chuck, and a hook,
the second holder comprising one of a second vacuum chuck and a second electrostatic chuck.

11. The method according to claim 10, wherein
when separating the bonded substrate, separating the bonded substrate with aid of at least one of injection of gas, injection of liquid, application of vibration, and application of sound wave to an interface between the first substrate and the memory cell.

12. The method according to claim 11, wherein
converting at least one of gas, liquid, vibration, and sound wave into pulse form when the injection or the application to the interface between the first substrate and the memory cell.

* * * * *